United States Patent
Okigawa et al.

(10) Patent No.: US 11,672,140 B2
(45) Date of Patent: Jun. 6, 2023

(54) SELF-LUMINOUS DISPLAY PANEL AND METHOD OF MANUFACTURING SELF-LUMINOUS DISPLAY PANEL

(71) Applicant: JOLED Inc., Tokyo (JP)

(72) Inventors: Akifumi Okigawa, Tokyo (JP); Kenji Harada, Tokyo (JP)

(73) Assignee: JOLED INC., Tokyo (JP)

( * ) Notice: Subject to any disclaimer, the term of this patent is extended or adjusted under 35 U.S.C. 154(b) by 174 days.

(21) Appl. No.: 17/111,535

(22) Filed: Dec. 4, 2020

(65) Prior Publication Data

US 2021/0175466 A1 Jun. 10, 2021

(30) Foreign Application Priority Data

Dec. 5, 2019 (JP) .............. JP2019-220600

(51) Int. Cl.
*H01L 51/52* (2006.01)
*H01L 27/32* (2006.01)
*H01L 51/56* (2006.01)

(52) U.S. Cl.
CPC ....... *H10K 50/8426* (2023.02); *H10K 50/844* (2023.02); *H10K 50/8428* (2023.02); *H10K 59/124* (2023.02); *H10K 71/00* (2023.02); *H10K 59/38* (2023.02); *H10K 2102/351* (2023.02)

(58) Field of Classification Search
CPC ............. H01L 51/5246; H01L 51/5253; H01L 27/3258; H01L 51/525; H01L 51/5256
See application file for complete search history.

(56) References Cited

U.S. PATENT DOCUMENTS

| | | | | |
|---|---|---|---|---|
| 9,343,698 | B2 * | 5/2016 | Negishi | ................ H01L 51/524 |
| 9,356,080 | B2 * | 5/2016 | Negishi | ............... H01L 27/3213 |
| 10,658,439 | B2 * | 5/2020 | Hanari | ............... H01L 51/5253 |
| 10,700,157 | B2 * | 6/2020 | Maeda | ............... H01L 51/5228 |
| 11,114,516 | B2 * | 9/2021 | Hanari | .............. H01L 27/3246 |
| 11,205,760 | B2 * | 12/2021 | Kamiya | ............. H01L 51/5072 |
| 11,296,167 | B2 * | 4/2022 | Koo | ..................... H01L 27/326 |
| 2003/0164677 | A1 | 9/2003 | Miyaguchi et al. | |

(Continued)

FOREIGN PATENT DOCUMENTS

JP    7-142170 A    6/1995
JP    2000-223264 A    8/2000

(Continued)

*Primary Examiner* — Victoria K. Hall
(74) *Attorney, Agent, or Firm* — Xsensus LLP

(57) ABSTRACT

A self-luminous display panel including a first substrate, an insulating resin layer, self-luminous elements, a sealing layer, an attachment layer, and a second substrate, and the insulating resin layer includes an inner insulating sublayer and an outer insulating sublayer with a groove therebetween, the groove being provided in a peripheral region and surrounding an image display region, the attachment layer includes a peripheral sealing layer that is positioned inside a peripheral portion of the second substrate and a joining layer that is positioned in a range surrounded by the peripheral sealing layer, and when viewed in a cross section perpendicular to a main surface of the first substrate and across the groove, the peripheral sealing layer is at least partially positioned on the outer insulating sublayer, and an inner end portion of the peripheral sealing layer extends to the groove.

8 Claims, 12 Drawing Sheets

(56) References Cited

U.S. PATENT DOCUMENTS

| | | | |
|---|---|---|---|
| 2005/0269926 A1* | 12/2005 | Fukuoka | H01L 51/5259 313/123 |
| 2008/0079360 A1* | 4/2008 | Kubota | H05B 33/04 313/505 |
| 2009/0051274 A1* | 2/2009 | Hayashi | H01L 51/5253 156/278 |
| 2010/0090596 A1* | 4/2010 | Ota | H01L 51/5246 445/25 |
| 2010/0213438 A1 | 8/2010 | Cho et al. | |
| 2015/0048326 A1 | 2/2015 | Cho et al. | |
| 2015/0060806 A1 | 3/2015 | Park et al. | |
| 2015/0060823 A1* | 3/2015 | Furuie | H01L 27/3223 257/40 |
| 2017/0012243 A1* | 1/2017 | Suzuki | H01L 51/525 |
| 2017/0186830 A1* | 6/2017 | Tokuda | H01L 51/5253 |
| 2018/0226608 A1* | 8/2018 | Nakagawa | H01L 51/0097 |
| 2018/0301651 A1* | 10/2018 | Kamiya | H01L 51/5253 |
| 2018/0342564 A1* | 11/2018 | Hanari | H01L 51/524 |
| 2020/0194534 A1* | 6/2020 | Park | H01L 51/5253 |
| 2020/0243623 A1* | 7/2020 | Hanari | H01L 27/1248 |
| 2021/0175470 A1* | 6/2021 | Kang | H01L 51/0097 |
| 2021/0351372 A1* | 11/2021 | Luo | H01L 51/56 |

FOREIGN PATENT DOCUMENTS

| | | |
|---|---|---|
| JP | 2001-4837 A | 1/2001 |
| JP | 2009-163975 A | 7/2009 |
| JP | 2009-176756 A | 8/2009 |
| JP | 2010-199067 A | 9/2010 |

* cited by examiner

Ultraviolet light irradiation (partial curing)

Pressure-bonding under vacuum

Reversing

Heat curing

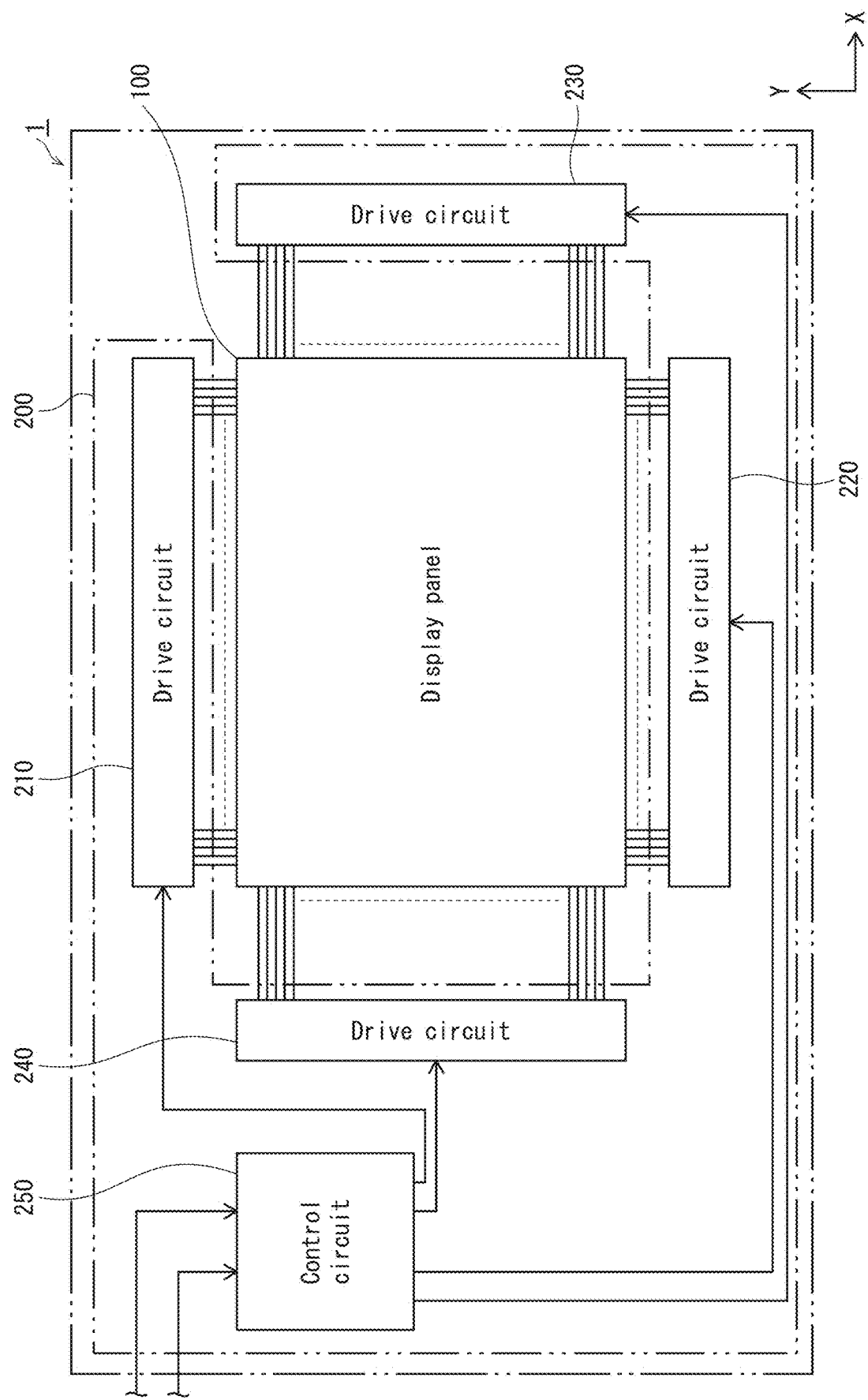

SELF-LUMINOUS DISPLAY PANEL AND METHOD OF MANUFACTURING SELF-LUMINOUS DISPLAY PANEL

This application claims priority to Japanese Patent Application No. 2019-220600 filed, Dec. 5, 2019, the contents of which are hereby incorporated by reference in their entirety.

BACKGROUND

Technical Field

The present disclosure relates to self-luminous display panels including a plurality of self-luminous elements such as organic electroluminescence (EL) elements and a method of manufacturing such self-luminous display panels, and in particular to a sealing technology for suppressing moisture penetration from the surrounding environment.

Description of Related Art

Organic EL display panels including a plurality of organic EL elements have been conventionally known. Each organic EL element has a multi-layered structure including a laminate of thin films of various materials, and includes at least a pixel electrode and a common electrode with an organic light-emitting layer disposed therebetween on a thin film transistor (TFT) substrate covered by a planarization insulating layer. As necessary, at least one of a hole injection layer, a hole transport layer, an electron injection layer, an electron transport layer, and the like is disposed between the pixel electrode and the organic light-emitting layer or between the common electrode and the organic light-emitting layer.

These layers may include a material whose luminescent properties deteriorate due to reaction with moisture. Thus, in order to suppress deterioration over time of display quality of the organic EL display panels, a sealing layer is formed as an upper layer of the common electrode to suppress moisture penetration from the surrounding environment.

Such a sealing layer conventionally has been formed by using an inorganic material such as silicon nitride through a dry process such as CVD. An inorganic material such as silicon nitride has a merit of not transmitting moisture, gas, and the like, but, on the other hand, has a demerit of easily having cracks due to for example application of an external force.

In view of this, a technique for improving sealing properties while suppressing crack occurrence has been devised. Specifically, a sealing layer is formed so as to have a three-layer structure including a first sublayer, a second sublayer, and a third sublayer which respectively include an inorganic material, a resin material, and an inorganic material. The second sublayer is disposed between the first sublayer and the third sublayer such that a buffer action is exerted. This improves sealing properties and also suppresses crack occurrence (for example, Japanese Patent Application Publication No. 2000-223264).

According to typical organic EL display panels, a color filter substrate (CF substrate) is often disposed on a sealing layer so as to perform chromaticity adjustment of light emission colors of light-emitting layers. FIG. 12 is a schematic cross-section diagram illustrating a structure of a periphery of an organic EL display panel supposed to be used in this case.

In the figure, an organic EL layer 603 including organic EL elements arranged in a matrix is formed on a substrate 601 via an insulating resin layer 602.

A sealing layer 610 is formed so as to cover the organic EL layer 603. The sealing layer 610 has a three-layer structure including a first sublayer 604, a second sublayer 605, and a third sublayer 606 which respectively include silicon nitride, a resin material, and silicon nitride. The second sublayer 605 is disposed between the first sublayer 604 and the third sublayer 606.

Specifically, the first sublayer 604 is formed by forming a silicon nitride film through a dry process such as CVD. The second sublayer 605 is formed by applying an ink containing a resin material onto the first sublayer 604 and curing the ink. The third sublayer 606 is formed by forming a silicon nitride film on a top surface of the second sublayer 605 through CVD.

According to a typical method of forming such a second sublayer, an ink containing a resin material is applied by ejecting ink droplets in a target range from nozzles by an inkjet process, from the viewpoint of workability and process costs.

The ink used in this case has a low viscosity in order to avoid nozzle clog, and accordingly spreads over a target application region. Owing to a surface tension of the ink at an outer peripheral edge portion of the target application region, the second layer has a film thickness which gradually decreases in a manner as if a profile of a surface of the second layer in a cross section curves gently, as illustrated in FIG. 12 (hereinafter, this portion of the second sublayer which gradually decreases in film thickness is referred to as drooped portion).

On the second sublayer 605 having a drooped portion 605a at its outer peripheral portion, the third sublayer 606, a joining layer 607, and the CF substrate 608 are disposed in this order. Accordingly, the CF substrate 608 similarly has a drooped portion 608a along the curved shape of the drooped portion 605a.

In the case where the CF substrate 608 as a finished product has the drooped portion 608a at its outer peripheral portion in this way, the curved surface of the drooped portion 608a causes a difference in viewing angle between a central portion and an outer peripheral edge portion of a display screen of the organic EL display panel, and thus an irregular viewing angle occurs. Due to this, especially when the display screen is viewed obliquely, appearance of color differs between the central portion and the outer peripheral edge portion, and this is recognized as noises thus to cause deterioration in image quality.

In response to this problem, for example Japanese Patent Application Publication No. 2009-176756 has proposed a structure in which a spacer is disposed inside an outer peripheral edge of the CF substrate 608 in order to avoid generation of the drooped portion 608a at the outer peripheral portion of the CF substrate 608.

SUMMARY

A self-luminous display panel pertaining to at least one aspect of the present disclosure is a self-luminous display panel that has an image display region and a peripheral region around the image display region in plan view. The self-luminous display panel includes: a first substrate; an insulating resin layer that is disposed above the first substrate; self-luminous elements that are disposed above the insulating resin layer in an area corresponding to the image display region; a sealing layer that is disposed above the self-luminous elements; an attachment layer that is disposed above the sealing layer; and a second substrate that is disposed above the attachment layer. The insulating resin layer includes an inner insulating sublayer and an outer insulating sublayer with a groove therebetween. The groove is provided in the peripheral region and surrounds the image display region. The sealing layer includes a first sealing sublayer, a second sealing sublayer, and a third sealing sublayer that respectively include an inorganic material, a resin material, and an inorganic material. In a range in plan view including the image display region and extending to at most an inner end portion of the outer insulating sublayer, the first sealing sublayer, the second sealing sublayer, and the third sealing sublayer are layered in this order. Outside the range in plan view, the first sealing sublayer and the third sealing sublayer are in direct contact with each other. The attachment layer includes: a peripheral sealing layer that is positioned inside a peripheral portion of the second substrate; and a joining layer that is positioned in a range surrounded by the peripheral sealing layer. When viewed in a cross section perpendicular to a main surface of the first substrate and across the groove, the peripheral sealing layer is at least partially positioned on the outer insulating sublayer, and an inner end portion of the peripheral sealing layer is positioned outside an inner edge portion of the groove.

Also, a method of manufacturing a self-luminous display panel pertaining to at least one aspect of the present disclosure is a method of manufacturing a self-luminous display panel that has an image display region and a peripheral region around the image display region in plan view including: preparing a first substrate; forming an insulating resin layer above the first substrate; forming self-luminous elements above the insulating resin layer in an area corresponding to the image display region; forming a sealing layer above the self-luminous elements; and joining a second substrate onto the sealing layer. The forming the insulating resin layer includes providing, in the peripheral region, a groove surrounding the image display region, so as to divide the insulating resin layer into an inner insulating sublayer and an outer insulating sublayer. The forming the sealing layer includes: layering, in a range in plan view including the image display region and extending to at most an inner end portion of the outer insulating sublayer, a first sealing sublayer, a second sealing sublayer, and a third sealing sublayer in this order, the first sealing sublayer, the second sealing sublayer, and the third sealing sublayer respectively including an inorganic material, a resin material, and an inorganic material; and layering, outside the range in plan view, the first sealing sublayer and the third sealing sublayer in direct contact with each other. The joining the second substrate includes joining the second substrate onto the sealing layer via a peripheral sealing layer and a joining layer. The peripheral sealing layer is disposed inside a peripheral portion of the second substrate. The joining layer is disposed in a range surrounded by the peripheral sealing layer. When viewed in a cross section perpendicular to a main surface of the first substrate and across the groove, the peripheral sealing layer is at least partially positioned on the outer insulating sublayer, and an inner end portion of the peripheral sealing layer is positioned outside an inner edge portion of the groove.

BRIEF DESCRIPTION OF THE DRAWINGS

Objects, advantages, and features of the technology pertaining to the present disclosure will become apparent from the following description thereof taken in conjunction with the accompanying drawings, which illustrate at least one embodiment of the technology pertaining to the present disclosure.

FIG. 8 is a schematic diagram illustrating a structure of an organic EL display device on which the organic EL display panel pertaining to the first embodiment is mounted.

DETAILED DESCRIPTION

It was proved that the structure such as in Japanese Patent Application Publication No. 2009-176756 contributes to suppression of occurrence of an irregular viewing angle at an outer peripheral edge portion, but, on the other hand, might deteriorate sealing properties of a sealing layer.

Figure 13:
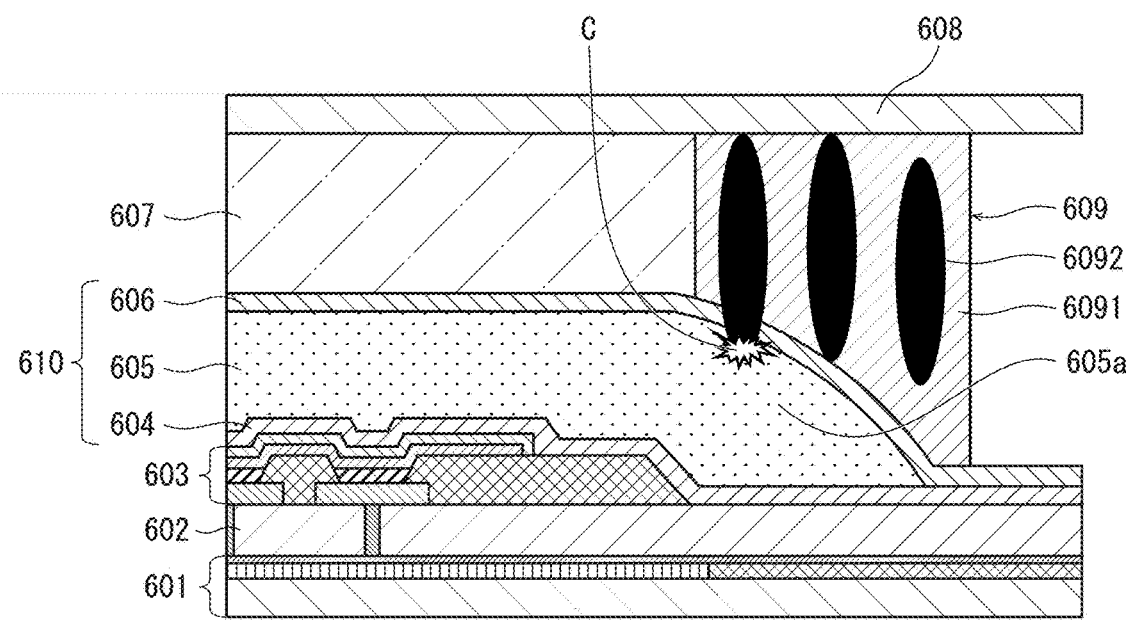
FIG. 13 is a schematic cross-section diagram illustrating a layered structure of a peripheral portion of a conventional organic EL display panel.

FIG. 13 is a schematic cross-section diagram of an outer peripheral portion of an organic EL display panel for explaining a cause of this problem.

As illustrated in the figure, a peripheral sealing layer 609 is disposed on a drooped portion 605a, and a CF substrate 608 is joined via the peripheral sealing layer 609. Accordingly, the CF substrate 608 does not have a drooped portion unlike the case in FIG. 12, and has a peripheral portion which is flat. This suppresses occurrence of an irregular viewing angle at a peripheral portion of an image display region.

Meanwhile, the peripheral sealing layer 609 is formed by applying, to the inside of the outer peripheral edge of the CF substrate 608, a peripheral sealing layer resin material 6091 which is a fluid and solid resin material in which spherical gap-forming materials 6092 are dispersed. Then, the CF substrate 608 is bonded by pressure to a sealing layer 610 disposed above a substrate 601.

In pressure-bonding of the CF substrate 608 under vacuum, a relatively strong force is applied. This might cause bottoms of the gap-forming materials 6092 to come into abutment with and break through a third sublayer 606, thus generating cracks c. A resin material typically has insufficient barrier properties against moisture, air, and the like, and thus cannot sufficiently block penetration of external moisture, air, and the like through the cracks c. As a result, compositional elements of organic EL elements deteriorate due to reaction with such moisture, air, and the like (especially oxygen).

The gap-forming materials 6092 are drawn as vertical ellipses in FIG. 13. This is because a scale factor in a thickness direction (Z direction) is considerably larger than a scale factor in a lateral direction (X direction) in the figure for easy understanding of a layered structure of an organic EL display panel. Gap-forming materials used in practice are substantially spherical.

A similar problem might occur not only in organic EL display panels using organic EL elements as self-luminous elements but also in self-luminous display panels typically including self-luminous elements which might deteriorate due to reaction with external moisture, air, and the like, such as inorganic EL display panels using inorganic EL elements as self-luminous elements and quantum dot display panels using quantum dot light-emitting diodes (QLEDs) as self-luminous elements.

A self-luminous display panel pertaining to at least one aspect of the present disclosure is a self-luminous display panel that has an image display region and a peripheral region around the image display region in plan view. The self-luminous display panel includes: a first substrate; an insulating resin layer that is disposed above the first substrate; self-luminous elements that are disposed above the insulating resin layer in an area corresponding to the image display region; a sealing layer that is disposed above the self-luminous elements; an attachment layer that is disposed above the sealing layer; and a second substrate that is disposed above the attachment layer. The insulating resin layer includes an inner insulating sublayer and an outer insulating sublayer with a groove therebetween. The groove is provided in the peripheral region and surrounds the image display region. The sealing layer includes a first sealing sublayer, a second sealing sublayer, and a third sealing sublayer that respectively include an inorganic material, a resin material, and an inorganic material. In a range in plan view including the image display region and extending to at most an inner end portion of the outer insulating sublayer, the first sealing sublayer, the second sealing sublayer, and the third sealing sublayer are layered in this order. Outside the range in plan view, the first sealing sublayer and the third sealing sublayer are in direct contact with each other. The attachment layer includes: a peripheral sealing layer that is positioned inside a peripheral portion of the second substrate; and a joining layer that is positioned in a range surrounded by the peripheral sealing layer. When viewed in a cross section perpendicular to a main surface of the first substrate and across the groove, the peripheral sealing layer is at least partially positioned on the outer insulating sublayer, and an inner end portion of the peripheral sealing layer is positioned outside an inner edge portion of the groove.

This aspect suppresses deterioration of image quality due to an irregular viewing angle at a peripheral portion of the image display region, while achieving sealing properties to prevent deterioration of the self-luminous elements.

Also, according to a self-luminous display panel pertaining to at least one aspect of the present disclosure, at the inner end portion of the peripheral sealing layer, thickness of the second sealing sublayer is smaller than thickness of the outer insulating sublayer.

This aspect suppresses a pressing force applied by the inner end portion of the peripheral sealing layer to the third sealing sublayer included in the sealing layer, at least compared with the conventional structure, thereby reducing a risk of damage on the third sealing sublayer and thus deterioration in sealing properties. Note that the phrase "at the inner end portion of the peripheral sealing layer, thickness of the second sealing sublayer is smaller than thickness of the outer insulating sublayer." includes the following case where the thickness of the second sealing sublayer at the inner end portion of the peripheral sealing layer is "zero", in other words, the second sealing sublayer does not extend to a position corresponding to the inner end portion of the peripheral sealing layer.

Also, according to a self-luminous display panel pertaining to at least one aspect of the present disclosure, outside the range in plan view, the first sealing sublayer and the third sealing sublayer cover an outer end portion of the outer insulating sublayer.

This aspect prevents penetration of moisture and the like from the outer insulating sublayer, thereby further improving the sealing properties.

Also, according to a self-luminous display panel pertaining to at least one aspect of the present disclosure, in plan view, an outer end portion of the peripheral sealing layer is positioned outside an outer end portion of the outer insulating sublayer.

Even this aspect prevents penetration of moisture and the like from the outer insulating sublayer, thereby further improving the sealing properties.

Also, according to a self-luminous display panel pertaining to at least one aspect of the present disclosure, the second substrate is a color filter substrate including filters of at least a red color, a green color, and a blue color.

This aspect enables the second substrate to have a function of not only improving the sealing properties but also improving purity of light emission colors of the self-luminous elements.

Also, according to a self-luminous display panel pertaining to at least one aspect of the present disclosure, the second sealing sublayer is an applied film.

This aspect enables the second sealing sublayer to be formed easily by an application method.

Also, according to a self-luminous display panel pertaining to at least one aspect of the present disclosure, the peripheral sealing layer includes an ultraviolet-curing resin material in which spherical gap-forming materials are dispersed.

This aspect enables the peripheral sealing layer to easily perform thickness regulation by including the gap-forming materials.

Also, a method of manufacturing a self-luminous display panel pertaining to at least one aspect of the present disclosure is a method of manufacturing a self-luminous display panel that has an image display region and a peripheral region around the image display region in plan view including: preparing a first substrate; forming an insulating resin layer above the first substrate; forming self-luminous elements above the insulating resin layer in an area corresponding to the image display region; forming a sealing layer above the self-luminous elements; and joining a second substrate onto the sealing layer. The forming the insulating resin layer includes providing, in the peripheral region, a groove surrounding the image display region, so as to divide the insulating resin layer into an inner insulating sublayer and an outer insulating sublayer. The forming the sealing layer includes: layering, in a range in plan view including the image display region and extending to at most an inner end portion of the outer insulating sublayer, a first sealing sublayer, a second sealing sublayer, and a third sealing sublayer in this order, the first sealing sublayer, the second sealing sublayer, and the third sealing sublayer respectively including an inorganic material, a resin material, and an inorganic material; and layering, outside the range in plan view, the first sealing sublayer and the third sealing sublayer in direct contact with each other. The joining the second substrate includes joining the second substrate onto the sealing layer via a peripheral sealing layer and a joining layer. The peripheral sealing layer is disposed inside a peripheral portion of the second substrate. The joining layer is disposed in a range surrounded by the peripheral sealing layer. When viewed in a cross section perpendicular to a main surface of the first substrate and across the groove, the peripheral sealing layer is at least partially positioned on the outer insulating sublayer, and an inner end portion of the peripheral sealing layer is positioned outside an inner edge portion of the groove.

This aspect suppresses deterioration of image quality due to an irregular viewing angle at a peripheral portion of the image display region, while achieving sealing properties to prevent deterioration of the self-luminous elements.

Note that in at least one embodiment of the present disclosure above, the term "above" does not indicate an upper direction (upward in the vertical direction) in an absolute spatial awareness, but is defined by a relative relationship based on a layering order in a layered structure of the self-luminous display panel. Specifically, a direction that is perpendicular to the main surface of the substrate of the self-luminous display panel and is toward a laminate from the substrate is defined as an upper direction. Also, for example an expression "on the substrate" indicates not only a region in direct contact with the substrate but also an upper region distant from the substrate via the laminate. Further, for example an expression "above the substrate" indicates not only the upper region distant from the substrate via the laminate but also the region in direct contact with the substrate.

The following describes a self-luminous display panel pertaining to at least one aspect of the present disclosure by using an example of an organic EL display panel of a top-emission type, with reference to the drawings. Note that the drawings may be schematic, and are not necessarily to scale.

First Embodiment

1. Structure of Organic EL Display Panel 100

1.1 Outline of Structure

Figure 1:
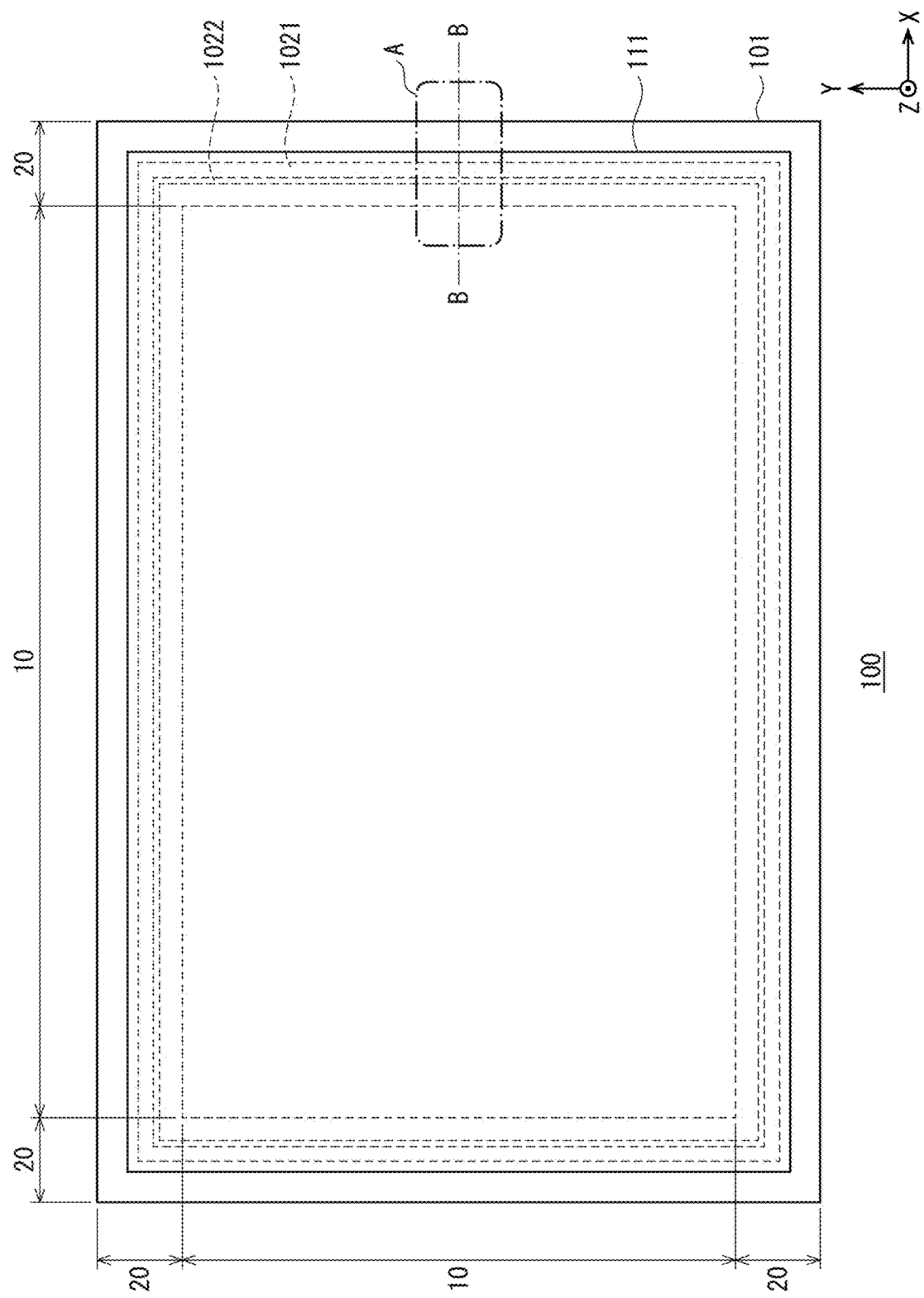
FIG. 1 is a layout in plan view illustrating an organic EL display panel pertaining to a first embodiment that is one embodiment of the present disclosure.

FIG. 1 is a layout in plan view illustrating an organic EL display panel 100 pertaining to a first embodiment.

As illustrated in the figure, the organic EL display panel 100 has an image display region 10 and a peripheral region 20 around the image display region 10 in plan view.

In the image display region 10, pixels are arranged in a matrix. Each pixel includes subpixels of different colors. In the present embodiment, each pixel includes a red subpixel, a green subpixel, and a blue subpixel. Each subpixel corresponds to an organic EL element.

In the peripheral region 20, meanwhile, terminals (not illustrated) are provided for electrically connection to external drive circuits.

1.2 Layered Structure of Organic EL Display Panel 100

Figure 2:
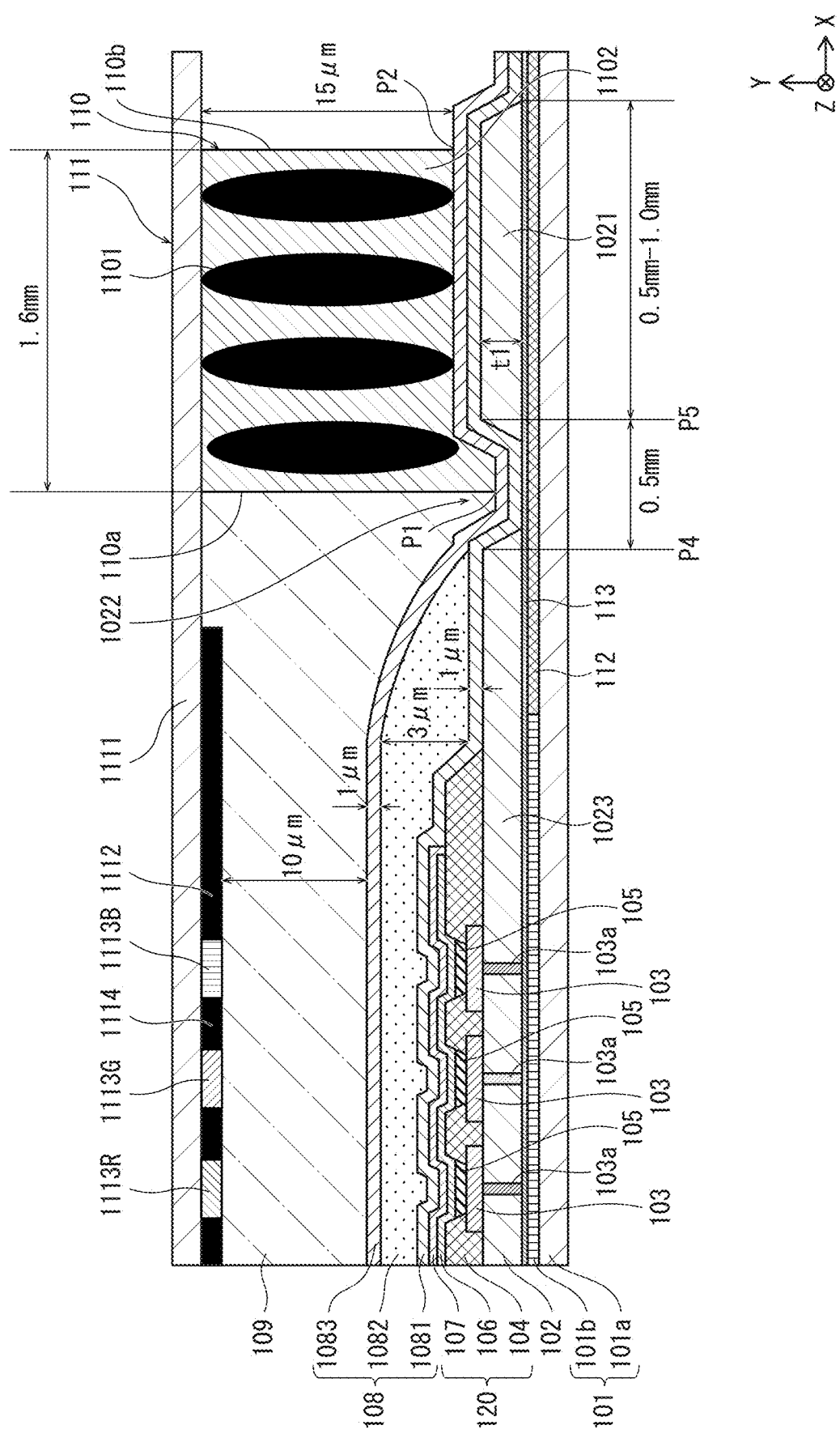
FIG. 2 is a partial cross-section diagram illustrating a layered structure of the organic EL display panel pertaining to the first embodiment, taken along a line B-B in a region A in FIG. 1.

FIG. 2 is a partial cross-section diagram illustrating a layered structure of an outer peripheral edge portion of the organic EL display panel 100, taken along a line B-B in a region A in FIG. 1.

As illustrated in the figure, the organic EL display panel 100 includes a lower substrate 101 (first substrate), an interlayer insulating layer (insulating resin layer) 102, pixel electrodes 103, bank layers 104, light-emitting layers 105, an electron transport layer 106, a counter electrode 107, a sealing layer 108, a color filter substrate 111 (second substrate) as an upper substrate, a wiring layer 112, and a passivation film 113. Among these compositional elements, the pixel electrodes 103, the bank layers 104, and the light-emitting layers 105, and so on correspond one-to-one with the subpixels. Also, among these compositional elements, the pixel electrodes 103, the bank layers 104, the light-emitting layers 105, the electron transport layer 106, and the counter electrode 107 are referred to collectively as organic EL layer 120.

(1) Lower Substrate (First Substrate)

The lower substrate 101 includes a base material 101a which is an electrically-insulating material and a TFT layer 101b. The TFT layer 101b has a known TFT driving circuit formed therein for each subpixel.

Typically, a glass sheet is used as the base material 101a. In at least one embodiment, in the case where priority is given to flexibility, a sheet including an insulating resin material is used as the base material 101a in this case. Either thermoplastic resin or thermosetting resin is usable as the resin material, including polyethylene, polypropylene, polyamide, polyimide (PI), polycarbonate, acrylic resin, polyethylene terephthalate (PET), polybutylene terephthalate, polyacetal, other fluororesin, thermoplastic elastomer such as styrene elastomer, polyolefin elastomer, polyvinyl chloride elastomer, polyurethane elastomer, fluorine rubber elastomer, and chlorinated polyethylene elastomer, epoxy resin, unsaturated polyester, silicone resin, polyurethane, or a copolymer, a blend, a polymer alloy or the like mainly including such a material described above. The sheet may be a laminate of any one type or any two or more types of the materials described above.

(2) Wiring Layer

The wiring layer 112 includes wirings extracted from the TFT layer 101b. The wirings are spaced away from each other, and include for example an electrically-conductive material such as a metal including chromium (Cr), molybdenum (Mo), aluminum (Al), titanium (Ti), and copper (Cu) or an alloy including MoW, MoCr, and NiCr.

(3) Passivation Film

The passivation film 113 is an insulating protective film covering the TFT layer 101b and the wiring layer 112, and includes silicon nitride (SiN), silicon oxide (SiO), silicon oxynitride (SiON), or the like. Connection terminals (not illustrated) which are extracted from the wiring layer 112 are exposed from the passivation film 113 in the peripheral region 20, and are connected to drive circuits described later.

(4) Interlayer Insulating Layer

The interlayer insulating layer (insulating resin layer) 102 is formed above the lower substrate 101. The interlayer insulating layer 102 includes an insulating resin material, and has a thickness of for example 3 μm. The interlayer insulating layer 102 is provided for flattening irregularities in a top surface of the passivation film 113 formed on the TFT layer 101b. The resin material is for example acrylic resin, polyimide resin, siloxane resin, or phenolic resin.

In the peripheral region 20, a groove 1022 is provided in the interlayer insulating layer 102 along an outer peripheral edge of the interlayer insulating layer 102 (see FIG. 1) (hereinafter, this groove is referred to as peripheral groove). The interlayer insulating layer 102 is divided completely by the peripheral groove 1022 into an inner insulating sublayer 1023 and an outer insulating sublayer 1021, and the passivation film 113 is exposed at a bottom of the peripheral groove 1022.

As described above, the interlayer insulating layer 102 includes an electrically-insulating material such as polyimide resin or acrylic resin and easily absorbs moisture. However, the peripheral groove 1022 prevents moisture penetration into the image display region 10 even when moisture penetrates into the outer insulating sublayer 1021 outside the peripheral groove 1022, from a substrate outer edge direction.

Also, when a second sealing sublayer 1082 of the sealing layer 108 is formed by an application method, a resin material of the second sealing sublayer 1082 is fluid while being applied. Accordingly, the resin material might spread up to positions of the connection terminals (not illustrated) which are provided for external connection. However, the peripheral groove 1022 provided in this way functions as a "moat" such that an unnecessary spread of a resin material during formation of the second sealing sublayer 1082 is prevented at an edge of the peripheral groove 1022 which is closer to the image display region 10 than the peripheral region 20.

Further, even if the resin material flows into the peripheral groove 1022, the outer insulating sublayer 1021 functions as a kind of "dam" such that spread of the resin material applied during formation of the second sealing sublayer 1082 is prevented at an inner peripheral end portion of the outer insulating sublayer 1021.

(5) Pixel Electrodes

The pixel electrodes 103 include metal layers including a light-reflective metal material, and are formed on the interlayer insulating layer 102. The pixel electrodes 103 correspond one-to-one with the subpixels, and are electrically connected with the TFT layer 101b via contact holes.

In the present embodiment, the pixel electrodes 103 function as anodes.

Specific examples of the light-reflective metal material include silver (Ag), aluminum (Al), alloy of aluminum, molybdenum (Mo), alloy of silver, palladium, and copper (APC), alloy of silver, rubidium, and gold (ARA), alloy of molybdenum and chromium (MoCr), alloy of molybdenum and tungsten (MoW), and alloy of nickel and chromium (NiCr).

In at least one embodiment, the pixel electrodes 103 are single metal layers. In at least one embodiment, the pixel electrodes 103 have a layered structure including a metal oxide layer such as an indium tin oxide (ITO) layer or an indium zinc oxide (IZO) layer layered on a metal layer.

(6) Bank Layers

The bank layers 104 are formed so as to expose a portion of top surfaces of the pixel electrodes 103 and cover regions surrounding the exposed portion.

Regions of the top surfaces of the pixel electrodes 103 which are not covered by the bank layers 104 (hereinafter referred to as openings) correspond one-to-one with the subpixels.

The bank layers 104 include for example an insulating organic material such as acrylic resin, polyimide resin, novolac resin, or phenolic resin. In the case where an application method is used for forming the light-emitting layers 105, the bank layers 104 function as a structure for preventing an ink mixture between subpixels in each pixel. Meanwhile, in the case where a vapor deposition method is used for forming the light-emitting layers 105, the bank layers 104 function as a structure for placing a vapor deposition mask.

(7) Light-Emitting Layers

The light-emitting layers 105 are formed inside the openings of the bank layers 104, and each have a function of emitting light of R, G, or B color owing to recombination of holes and electrons.

Publicly-known materials are usable for a material of the light-emitting layers 105. Specific examples of the material of the light-emitting layers 105 include phosphor such as oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, and metal complex of 8-hydroxyquinoline compound, metal complex of 2-bipyridine compound, complex of a Schiff base and group III metal, oxine metal complex, and rare earth complex.

(8) Electron Transport Layer

The electron transport layer 106 has a function of transporting electrons from the counter electrode 107 to the light-emitting layers 105. The electron transport layer 106 includes for example an organic material having high electron transport properties. Specific examples of the organic material include π-electron low molecular organic materials such as oxadiazole derivative (OXD), triazole derivative (TAZ), and phenanthroline derivative (BCP, Bphen). In at least one embodiment, the electron transport layer 106 includes an organic material doped with a metal selected from alkaline metals or alkaline earth metals. Also, in at least one embodiment, the electron transport layer 106 includes for example a single metal selected from alkaline metals or alkaline earth metals, or a fluoride of such a metal.

(9) Counter Electrode

The counter electrode 107 includes a light-transmissive and electrically-conductive material, and is formed on the electron transport layer 106. The counter electrode 107 functions as a cathode.

The counter electrode 107 can include for example ITO or IZO. In at least one embodiment, the counter electrode 107 is a thin metal film of silver, alloy of silver, aluminum, alloy of aluminum, or the like.

(10) Sealing Layer

The sealing layer 108 has a function of preventing organic layers including the light-emitting layers 105 and the electron transport layer 106 from being exposed to moisture, air, and the like.

The sealing layer 108 has a three-layer structure including a first sealing sublayer 1081, the second sealing sublayer 1082, and a third sealing sublayer 1083 which are each light-transmissive.

The first sealing sublayer 1081 is a thin film of silicon nitride (SiN) and covers a top surface of the counter electrode 107.

The second sealing sublayer 1082 includes a resin material and covers a top surface of the first sealing sublayer 1081 except its peripheral portion. The resin material used for forming the second sealing sublayer 1082 is for example light-transmissive epoxy resin or acrylic resin.

The third sealing sublayer 1083 is a thin film of silicon nitride similarly to the first sealing sublayer 1081, and covers a top surface of the second sealing sublayer 1082.

In the peripheral region 20 in plan view, the first sealing sublayer 1081 extends beyond and covers an outer end portion of the outer insulating sublayer 1021 which includes a resin material, so as to cover the whole surface of the outer insulating sublayer 1021. This prevents penetration of moisture and the like into the image display region 10 via the outer insulating sublayer 1021.

The second sealing sublayer 1082 is formed on the first sealing sublayer 1081 using a resin material by an application method such as an inkjet process so as to have for example a substantially uniform film thickness of 3 μm in the image display region 10. Also, an outer edge of the second sealing sublayer 1082 only needs to be positioned closer to the image display region 10 than the inner peripheral edge (a position P5) of (a flat portion of) the outer insulating sublayer 1021 is. FIG. 2 illustrates an embodiment in which the outer edge of the second sealing sublayer 1082 is positioned closer to the image display region 10 than an inner peripheral edge (position P4) of the peripheral groove 1022 is. In this embodiment, the second sealing sublayer 1082 has a film thickness of "zero" at a position P1 where an inner end portion 110a of the peripheral sealing layer 110 is positioned.

At the position P1 in the peripheral groove 1022, gap-forming materials 1101 are not in abutment with the third sealing sublayer 1083 and also the second sealing sublayer 1082 is not disposed below the third sealing sublayer 1083. Thus, sealing properties of the sealing layer 108 cannot be impaired.

Note that the third sealing sublayer 1083 extends outside the outer insulating sublayer 1021, respective outer edge portions of the first sealing sublayer 1081 and the third sealing sublayer 1083 are in direct close contact with each other without the second sealing sublayer 1082 disposed therebetween.

This prevents direct penetration of external moisture into the interlayer insulating layer 102 and the second sealing sublayer 1082, thereby further improving the sealing properties of the sealing layer 108.

(11) Color Filter (CF) Substrate (Second Substrate)

The color filter substrate 111 includes a color filter layer 1112 formed on one surface of a sheet-like base material 1111, and is joined onto the sealing layer 108 via a joining layer 109 and a peripheral sealing layer 110 while the color filter layer 1112 faces downward.

The sheet-like base material 1111 is for example a light-transmissive material such as a cover glass or a light-transmissive resin film. Also, providing the sheet-like base material 1111 for example improves rigidity of the organic EL display panel 100, and prevents penetration of moisture, air, and the like.

The color filter layer 1112 includes color filters 1113R of the red (R) color, color filters 1113G of the green (G) color, and color filters 1113B of the blue (B) color which are formed so as to correspond in position to the respective R, G, and B subpixels, to transmit visible light of respective wavelengths corresponding to the R, G, and B colors. The color filter layer 1112 has a function of transmitting light emitted from the organic EL elements of the R, G, and B subpixels and correcting chromaticity of the light.

(12) Joining Layer and Peripheral Sealing Layer

The joining layer 109 is formed by curing a light-transmissive ultraviolet curable resin, and functions as an adhesive for joining the color filter substrate 111 onto a top surface of the sealing layer 108.

Also, the peripheral sealing layer 110 includes a light-transmissive ultraviolet curable resin in which the spherical gap-forming materials 1101 are dispersed, and is disposed at a peripheral portion of the color filter substrate 111 (see FIG. 2). This maintains the whole surface of the color filter substrate 111 in parallel with the lower substrate 101 (see FIG. 2).

Providing the joining layer 109 further prevents penetration of external moisture, air, and the like into the organic EL display panel 100.

According to the organic EL display panel 100 pertaining to the present embodiment, as can be seen from FIG. 2, since the peripheral sealing layer 110 keeps ends of the color filter substrate 111 horizontal, no irregular viewing angle occurs and thus no image noise occurs at the peripheral portion of the image display region.

In addition, according to the structure illustrated in FIG. 2, the position P1 of the inner end portion 110a of the peripheral sealing layer 110 is positioned within a range of a width of the peripheral groove 1022, and the second sealing sublayer 1082 is not present in a range from the position P1 to a position P2. Accordingly, the gap-forming materials 1101 of the peripheral sealing layer 110 do not come into abutment with and strongly push down the third sealing sublayer 1083, unlike the conventional structure such as illustrated in FIG. 13. Thus, the gap-forming materials 1101 do not damage the third sealing sublayer 1083 of the sealing layer 108 during pressure-bonding of the color filter substrate 111. This maintains excellent sealing properties. The joining layer 109 and the peripheral sealing layer 110 may be referred to collectively as attachment layer.

Note that the dimensions in FIG. 2 are just examples for reference, and the length and width of the compositional elements are not necessarily represented in accordance with a ratio of the dimensions for easy understanding of the layered structure.

2. Method of Manufacturing Organic EL Display Panel

The following describes a method of manufacturing the organic EL display panel 100, with reference to the drawings.

Figure 3:
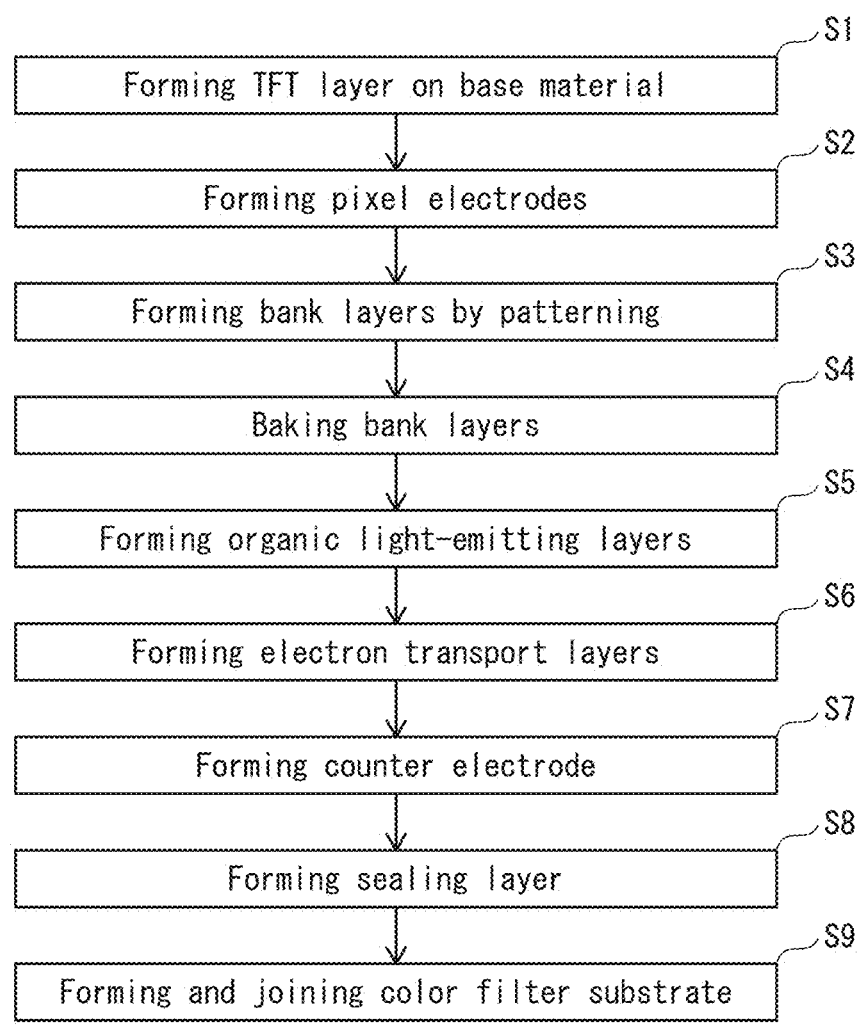
FIG. 3 is a flowchart illustrating a process of manufacturing the organic EL display panel pertaining to the first embodiment.

FIG. 3 is a flowchart illustrating a process of manufacturing the organic EL display panel 100.

(1) Formation of Lower Substrate 101

First, a lower substrate 101 is formed by forming a TFT layer 101b and a wiring layer 112 on a base material 101a (FIG. 3, Step S1). The TFT layer 101b and the wiring layer 112 can be formed by a known TFT manufacturing method.

Further, a passivation film 113 is formed on the TFT layer 101b. The passivation film 113 includes silicon nitride (SiN), silicon oxide (SiO), silicon oxynitride (SiON), or the like, and protects the TFT layer 101b and the wiring layer 112 against penetration of impurities included in an interlayer insulating layer 102 and bank layers 104. The passivation film 113 is formed by for example plasma CVD or sputtering.

The interlayer insulating layer 102 is formed on the passivation film 113. The interlayer insulating layer 102 can be formed by for example plasma CVD or sputtering.

Then, portions of the interlayer insulating layer 102 which correspond to portions on source electrodes of the TFT layer 101b are dry-etched to provide contact holes. The contact holes are provided such that for example surfaces of the source electrodes are exposed at bottoms of the contact holes.

Further, similarly through dry-etching, a peripheral groove 1022 is provided at a peripheral portion of the interlayer insulating layer 102 to divide the interlayer insulating layer 102 into an outer insulating sublayer 1021 and an inner insulating sublayer 1023. The interlayer insulating layer 102 is not present at a bottom of the peripheral groove 1022. That is, the dry-etching is performed until a top surface of the passivation film 113 is exposed at the bottom of the peripheral groove 1022.

Next, connection electrodes 103a are formed along inner walls of the contact holes. Upper portions of the connection electrodes 103a are partially disposed on the interlayer insulating layer 102 and the passivation film 113. The connection electrodes 103a can be formed by forming a metal film by for example sputtering, and then patterning the metal film by photolithography and wet etching.

In at least one embodiment, the interlayer insulating layer 102 is formed by a known photoresist process.

(2) Formation of Pixel Electrodes 103

Next, a pixel electrode material layer is formed on the interlayer insulating layer 102. The pixel electrode material layer can be formed by for example vacuum deposition or sputtering.

Then, the pixel electrode material layer is patterned by etching to form pixel electrodes 103 partitioned for each subpixel (FIG. 3, Step S2).

(3) Formation of Bank Layers 104

Next, a bank material layer is formed by applying a bank layer resin which is a material of bank layers 104 onto the pixel electrodes 103 and the interlayer insulating layer 102.

Specifically, a solution of a phenolic resin as the bank layer resin dissolved in a solvent (for example, a mixed solvent of ethyl lactate and γ-Butyrolactone (GBL)) is applied uniformly onto the pixel electrodes 103 and the interlayer insulating layer 102 by spin coating or the like. Thus, the bank material layer is formed. Then, the bank layers 104 are formed by pattern exposure and developing on the bank material layer (FIG. 3, Step S3), and the bank layers 104 are baked (Step S4). This defines openings in which light-emitting layers 105 are to be formed. Baking of the bank layers 104 is performed, for example, at a temperature of 150° C. to 210° C. for 60 minutes.

Further, in at least one embodiment, in the process of forming the bank layers 104, surfaces of the bank layers 104 are treated by using a defined liquid such as an alkaline solution, water, or an organic solvent, or by performing plasma treatment. This is in order to provide the surfaces of the bank layers 104 with repellency relative to an ink (solution) to be applied to the openings thereby to prevent mixture of the applied ink between subpixels in each pixel.

(4) Formation of Light-Emitting Layers 105

Next, an ink containing a component material of the light-emitting layers 105 is applied to the openings, which are defined by the bank layers 104, by using an inkjet device, and then the ink is dried (baked). Thus, the light-emitting layers 105 are formed (FIG. 3, Step S5). Other application methods include dispensing and screen printing.

(5) Formation of Electron Transport Layer 106

Next, an electron transport layer 106 is formed on the light-emitting layers 105 and the bank layers 104 (FIG. 3, Step S6). The electron transport layer 106 is formed through for example film formation across all the subpixels by vapor deposition.

(6) Formation of Counter Electrode 107

Next, a counter electrode 107 is formed on the electron transport layer 106 (FIG. 3, Step S7). The counter electrode 107 is formed through for example formation of a film of ITO, IZO, silver, aluminum, or the like by sputtering or vacuum vapor deposition.

(7) Formation of Sealing Layer 108

A sealing layer 108 is formed on the counter electrode 107 (FIG. 3, Step S8).

Figure 4A:
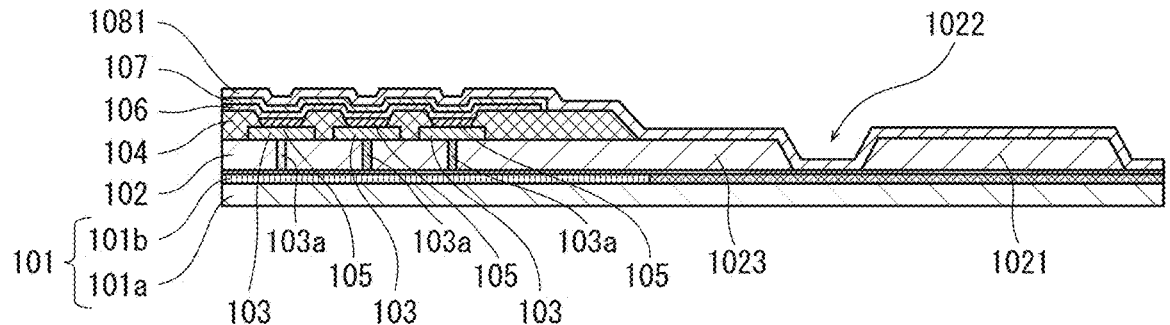
FIG. 4A to FIG. 4C are schematic cross-section diagrams for explaining part of the process of manufacturing the organic EL display panel pertaining to the first embodiment.

First, a first sealing sublayer 1081 is formed by forming an SiN film by for example plasma CVD (FIG. 4A). Silane ($SiH_4$) and ammonia ($NH_3$) are for example used as a material gas of the first sealing sublayer 1081. In at least one embodiment, nitrogen ($N_2$) is used additionally.

An outer edge of the first sealing sublayer 1081 extends outside a peripheral edge of the outer insulating sublayer 1021 in the peripheral region 20. Here, the first sealing sublayer 1081 is in direct contact with the passivation film 113 at the bottom of the peripheral groove 1022 and at portions outside the outer insulating sublayer 1021.

Figure 4B:
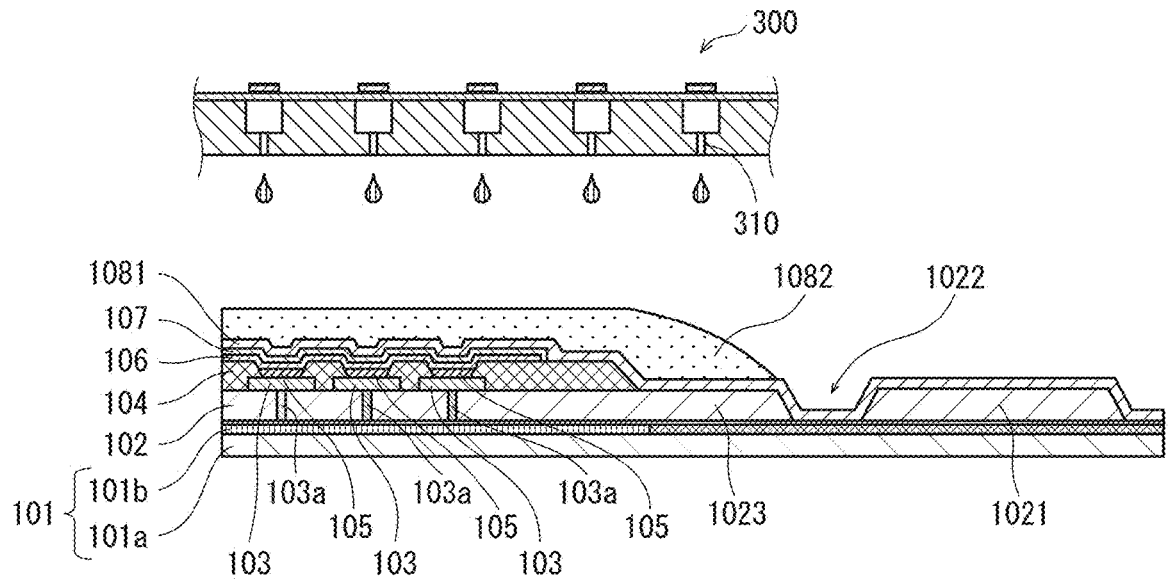

Next, a second sealing sublayer 1082 is formed by ejecting a resin material from a nozzle 310 of a head part 300 of an inkjet device onto the first sealing sublayer 1081 (FIG. 4B) and curing the resin material. For example, curing of the resin material is performed by heating the resin material if being thermosetting or by irradiating the resin material with ultraviolet light if being ultraviolet-curable.

Note that the resin material can be applied by screen printing, dispensing, spin coating, or the like as an alternative to the inkjet process described above.

Figure 4C:
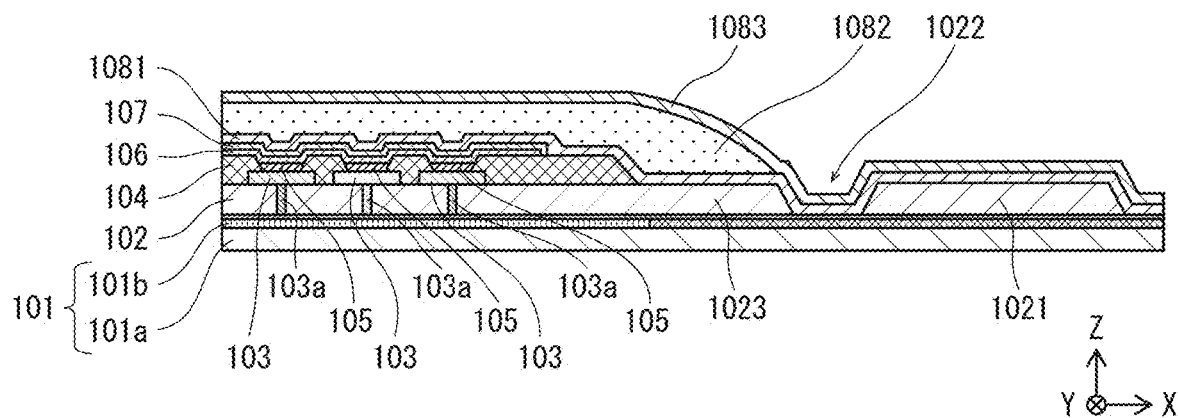

A third sealing sublayer 1083 is formed on the second sealing sublayer 1082 under the same film forming conditions as the first sealing sublayer 1081 (FIG. 4C).

As described above, owing to an edge cutting effect exhibited by the peripheral groove 1022, the outer edge of the second sealing sublayer 1082 is positioned closer to the inner insulating sublayer 1023 (light-emitting region) than an inner peripheral edge of the peripheral groove 1022 is, and the first sealing sublayer 1081 and the third sealing sublayer 1083 extend outside the outer insulating sublayer 1021 in plan view. Accordingly, respective outer edge portions of the first sealing sublayer 1081 and the third sealing sublayer 1083 are in direct contact with each other without the second sealing sublayer 1082 disposed therebetween. With this structure, the resin of the second sealing sublayer 1082 would not be exposed to the outside, and thus moisture and the like in the environment does not easily penetrate into the second sealing sublayer 1082.

(8) Formation and Joining of Color Filter Substrate 111

Next, a color filter substrate 111 is formed and joined onto the sealing layer 108 (FIG. 3, Step S9).

(8-1) Formation of Color Filter Substrate 111

Figure 5A:
FIG. 5A to FIG. 5G are schematic cross-section diagrams for explaining a process of manufacturing a color filter substrate of the organic EL display panel pertaining to the first embodiment.

First, a light-transmissive sheet-like base material 1111 is prepared, and a material of light-shielding layers 1114 that is primarily an ultraviolet curable resin (for example, ultraviolet curable acrylic resin) material to which a black pigment is added, is applied on one surface of the light-transmissive sheet-like base material 1111, thereby obtaining a light-shielding material layer 1114a (FIG. 5A).

Figure 5B:
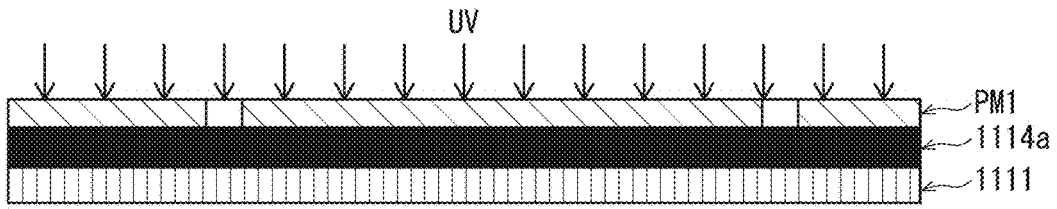

A pattern mask PM1 having predefined openings is overlaid on a top surface of the light-shielding material layer 1114a and is irradiated from above with ultraviolet light (FIG. 5B).

Figure 5C:
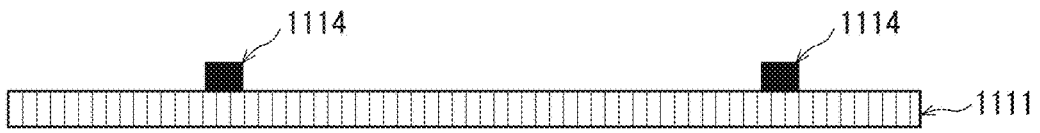

Then, the pattern mask PM1 and uncured portions of the light-shielding material layer 1114a are removed, developing is performed, and then curing is performed, Thus, the light-shielding layers 1114 are completed and each have for example a substantially rectangular shape in cross-section (FIG. 5C).

Figure 5D:
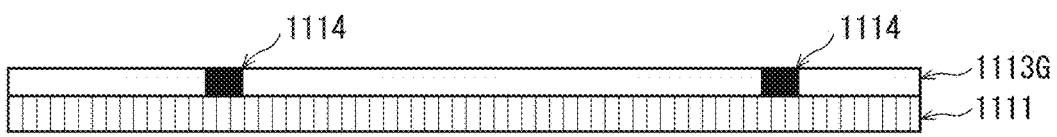

Next, a paste for color filters 1113, for example color filters 1113G, that is primarily an ultraviolet curable resin component is applied to a surface of the sheet-like base material 1111 on which the light-shielding layers 1114 are formed (FIG. 5D). Then, a predefined pattern mask PM2 is placed and ultraviolet irradiation is performed (FIG. 5E).

Subsequently, curing is performed, the pattern mask PM2 and uncured portions of the paste are removed, and developing is performed. Thus, the color filters 1113G are formed (FIG. 5F).

Figure 5E:
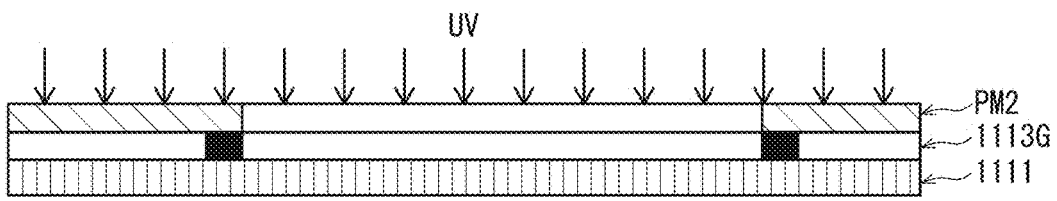
Figure 5F:
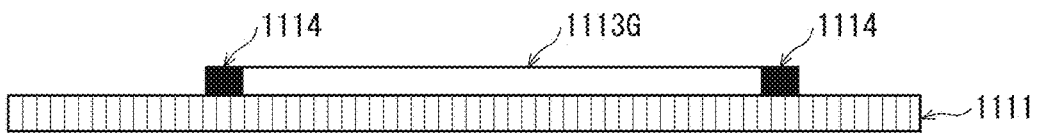
Figure 5G:
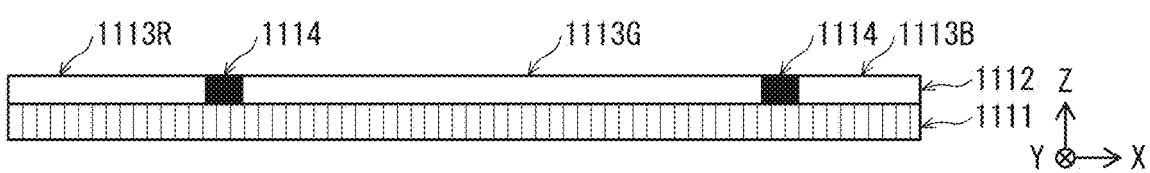

This process illustrated in FIG. 5D to FIG. 5F is repeated similarly for materials of red and blue color filters to form color filters 1113R and 1113B, respectively (FIG. 5G).

In at least one embodiment, commercially available color filter products are used, instead of using the pastes of the R, G, and B colors. Thus, the color filter substrate 111 is formed.

Also, in at least one embodiment, the color filter substrate 111 is formed in parallel with or before the manufacturing process illustrated in FIG. 3.

(8-2) Process of Joining Color Filter Substrate 111

Next, the color filter substrate 111 is joined to an intermediate product of an organic EL display panel 100 which includes every layer from the lower substrate 101 to the sealing layer 108 via an attachment layer including a joining layer 109 and a peripheral sealing layer 110. This intermediate product is hereinafter referred to as back panel 1200.

FIG. 6A to FIG. 6D are diagrams schematically illustrating a process of joining the color filter substrate 111.

Figure 6A:
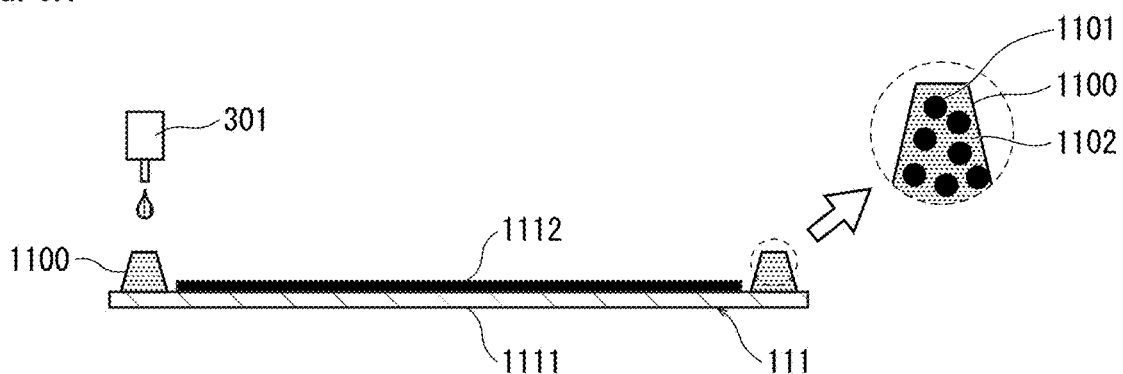
FIG. 6A to FIG. 6D are diagrams for explaining a process of joining the color filter substrate to an intermediate product of the organic EL display panel pertaining to the first embodiment.

First, a surface of the color filter substrate 111 on which the color filter layer 1112 is formed is turned upward. Through a nozzle 301 of an ink ejection device, an ink for forming the peripheral sealing layer 110 is applied in a frame-like shape to the inside of an outer peripheral edge of the color filter substrate 111 along the outer peripheral edge. Thus, a peripheral sealing layer precursor 1100 is formed (FIG. 6A).

This ink for forming the peripheral sealing layer 110 contains a resin material 1102 that is primarily an ultraviolet curable resin (for example acrylic resin, silicone resin, or epoxy resin) in which a large number of spherical and solid gap-forming materials 1101 having a diameter of 15 μm are mixed. In at least one embodiment, the ink for forming the peripheral sealing layer 110 has a viscosity slightly higher than a resin material of a joining layer 109.

This is because the ink for forming the peripheral sealing layer 110 also has a function as a kind of a "dam" preventing external leakage of the resin material of the joining layer 109 squashed due to pressure-bonding of the color filter substrate 111 to the back panel 1200.

Note that the diameter of the gap-forming materials 1101 does not necessarily need to be exactly 15 μm and may include a manufacturing tolerance because the ink for forming the peripheral sealing layer 110 even with some errors at least reduces an irregular viewing angle compared with conventional structures.

Figure 6B:
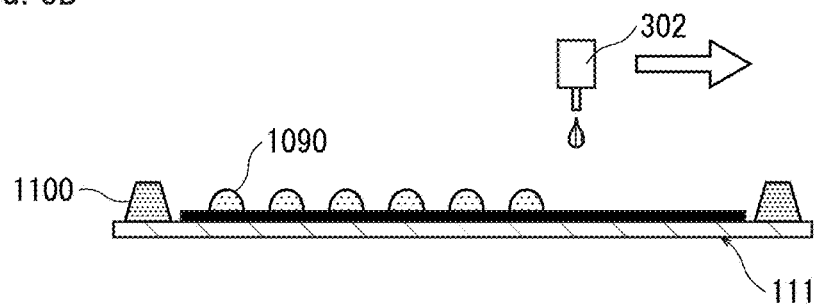

Next, through a nozzle 302 of the ink ejection device, an ink for forming the joining layer 109 is applied at appropriate intervals to a region surrounded by the peripheral sealing layer precursor 1100 having the frame-like shape on the sheet-like base material 1111. Thus, ink droplets 1090 are formed (FIG. 6B). This ink for forming the joining layer 109 contains a resin material that is primarily an ultraviolet curable resin similarly.

Figure 6C:
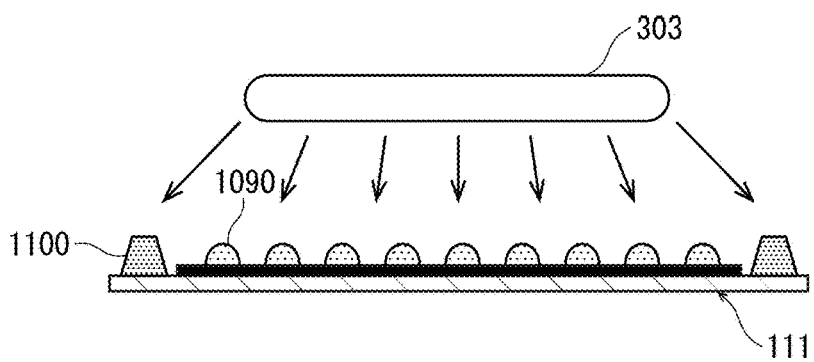
Figure 6D:
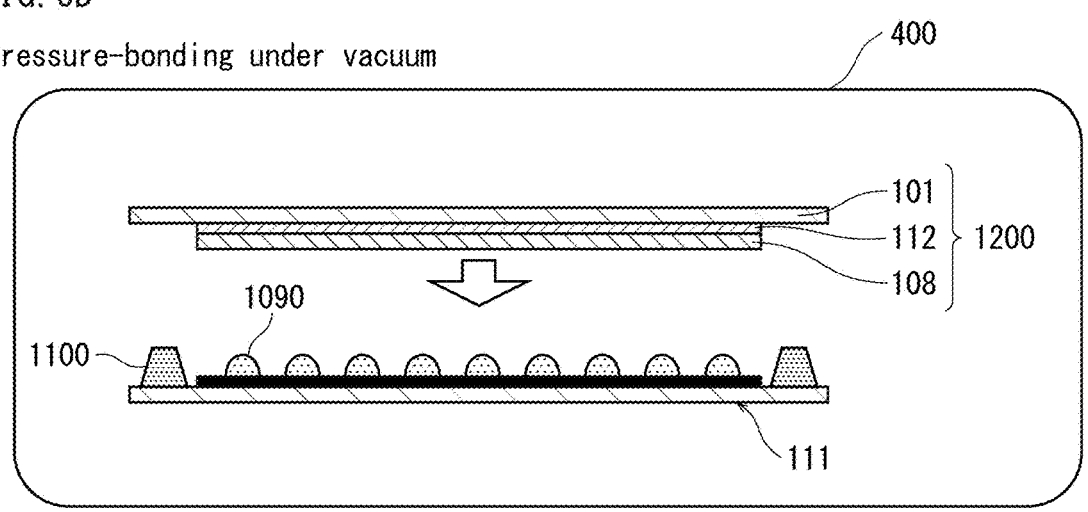

Then, the peripheral sealing layer precursor 1100 and the ink droplets 1090 are irradiated with ultraviolet light from above the sheet-like base material 1111 by an ultraviolet lamp 303, and thus are partially cured (FIG. 6C).

Then, the back panel 1200 and the color filter substrate 111 are joined to each other while positions relative to each other are maintained, and are carried into a vacuum chamber 400 for pressure-bonding under a vacuum generated by evacuation of air from the vacuum chamber 400. Thus, a semi-finished product 1000 of the organic EL display panel 100 is formed.

At this time, the ink droplets 1090 are squashed thus to be a joining layer in close contact with a top surface of the sealing layer 108. The peripheral sealing layer precursor 1100 is squashed, too, but does not become in diameter equal to or smaller than the gap-forming materials 1101 included therein. Thus, the peripheral sealing layer precursor 1100 functions as a spacer.

Further, the peripheral sealing layer precursor 1100 functions as a dam as described above, and accordingly prevents external leakage of the ink droplets 1090 formed thereinside. Thus, an appropriate adjustment of dropping amount of the ink droplets 1090 helps to closely join the color filter substrate 111 onto the sealing layer 108 while keeping the color filter substrate 111 flat.

Figure 7A:
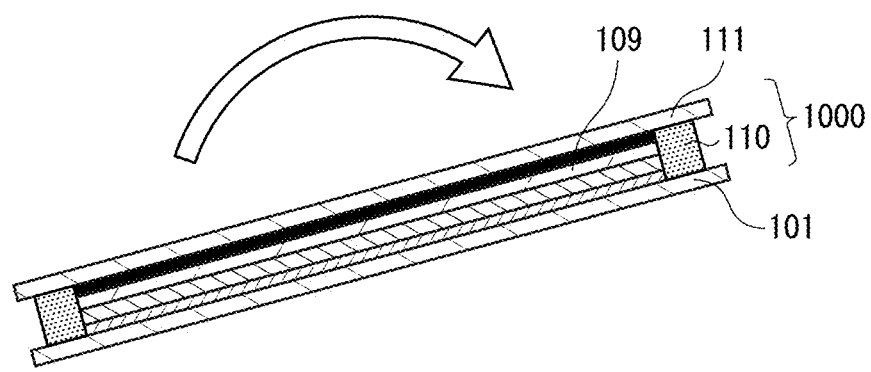
FIG. 7A and FIG. 7B are diagrams for explaining the process of manufacturing the organic EL display panel pertaining to the first embodiment, continuing from FIG. 6D.
Figure 7B:
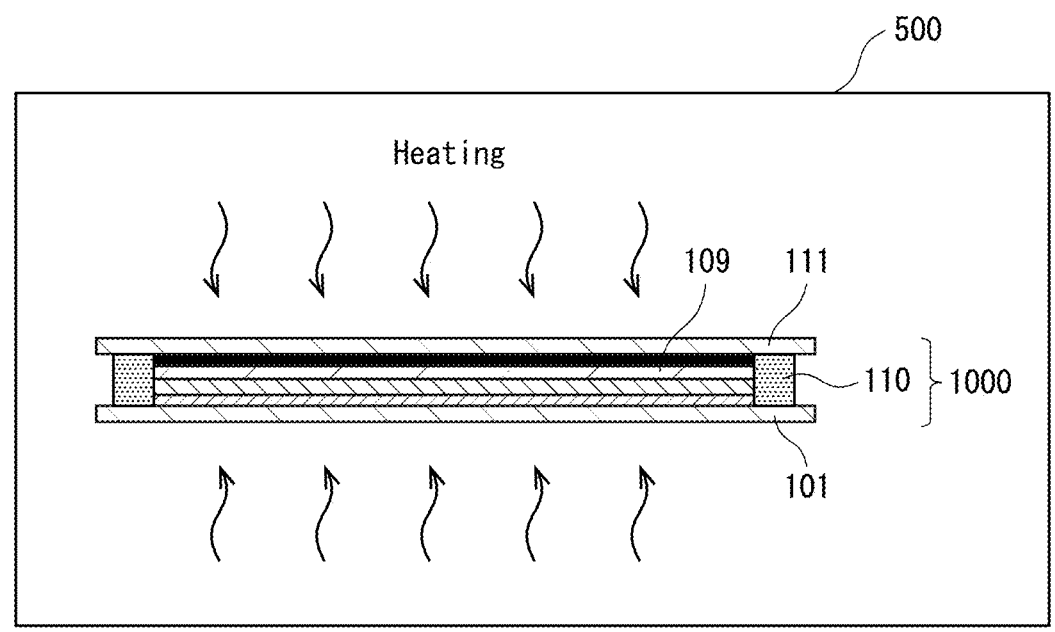

Subsequently, the semi-finished product 1000 is extracted from the vacuum chamber 400, is reversed upside down, and then is housed in a heating chamber 500 for heating and baking at a predefined temperature (FIG. 7B). Thus, the organic EL display panel 100 is completed.

Note that the order described above in which steps are executed is for illustrative purposes, and the steps may be in an order other than described above. Further, a portion of the steps described above may be executed simultaneously (in parallel) with another step.

3. Organic EL Display Device

FIG. 8 a block diagram illustrating the overall structure of an organic EL display device 1 on which the organic EL display panel 100 is mounted as a display unit. The organic EL display device 1 is a display device which is used for example for a television, a personal computer, a mobile terminal, or a display for business purposes such as an electronic signboard and a large screen for a commercial facility.

The organic EL display device 1 includes the organic EL display panel 100 and a drive controller 200 which is electrically connected to the organic EL display panel 100.

The drive controller 200 includes drive circuits 210-240 connected to the organic EL display panel 100 and a control circuit 250 connected to an external device such as a computer or a receiving device such as an antenna. The drive circuits 210-240 include power supply circuits for supplying electric power to the organic EL elements, signal circuits for applying a voltage signal for controlling the electric power supplied to the organic EL elements, a scanning circuit for switching a position to which the voltage signal is applied at regular intervals, and the like.

The control circuit 250 controls operations of the drive circuits 210-240 in accordance with data including image information input from the external device or the receiving device.

In FIG. 8, as an example, four of the drive circuits 210-240 are disposed around the organic EL display panel 100, but the structure of the drive controller 200 is not limited to this example, and the number and position of the drive circuits 210-240 may be modified as appropriate.

Second Embodiment

Figure 9:
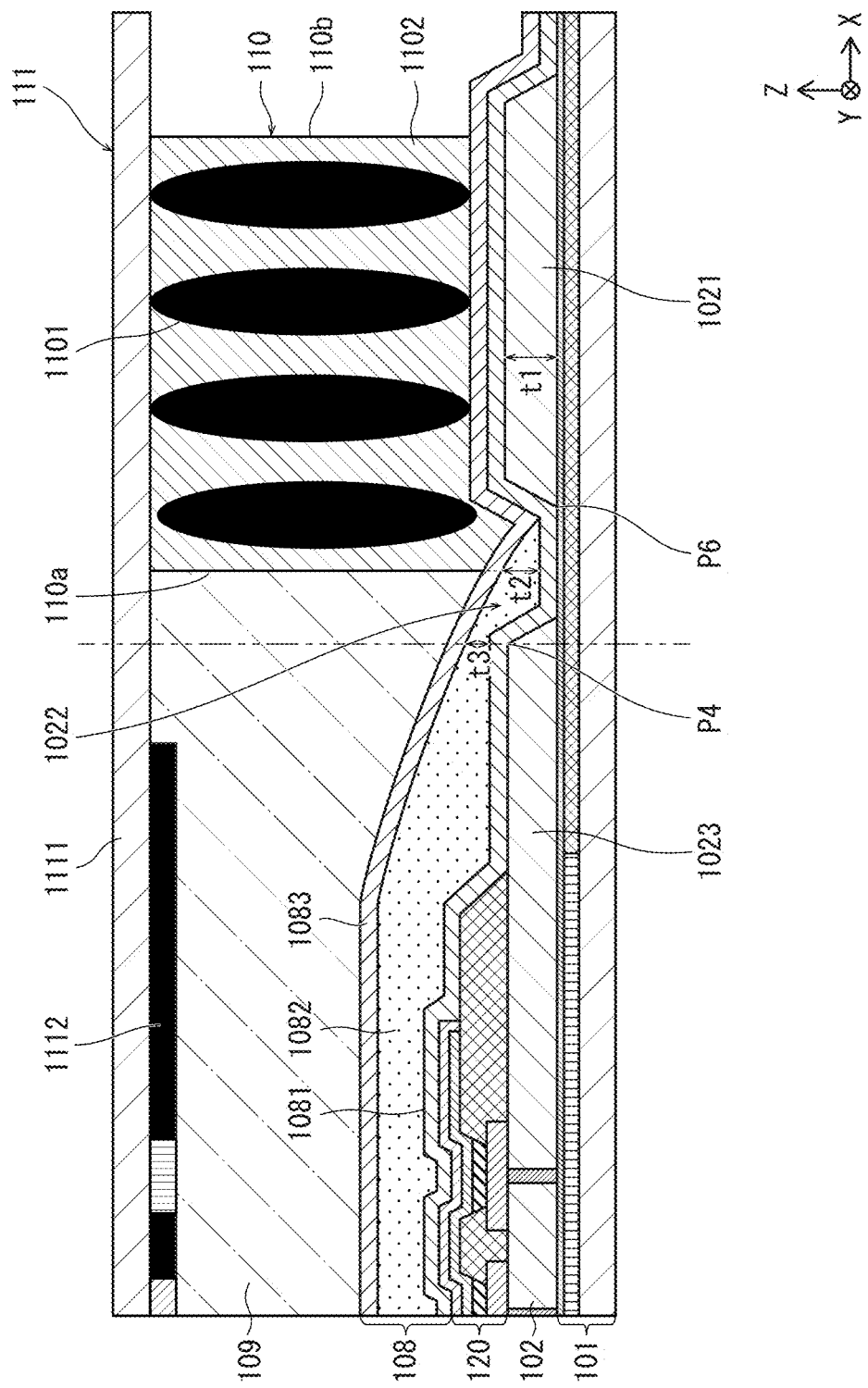
FIG. 9 is a schematic cross-section diagram illustrating a layered structure of an organic EL display panel pertaining to a second embodiment that is one embodiment of the present disclosure.

In the above first embodiment, the description has been provided on the example where the spread of the resin material of the second sealing sublayer 1082 stops inside an inner edge portion of the peripheral groove 1022 (position close to the image display region 10) (see FIG. 2). However, the peripheral portion of the second sealing sublayer 1082 can extend to the inside of the peripheral groove 1022 as illustrated in FIG. 9, depending on changes in manufacturing environment such as temperature, slight fluctuations in ink concentration, differences in viscosity between types of ink materials, and so on. Here, the outer insulating sublayer 1021 functions as a dam to prevent the peripheral portion of the second sealing sublayer 1082 from extending beyond an inner end of the outer insulating sublayer 1021 and extending further outwards (to a flat portion of a top surface of the outer insulating sublayer 1021).

Note that the scale factor in the thickness direction is exaggerated in FIG. 9. In practice, the thickness of the sealing layer 108 is 5 μm at most in the image display region 10 (see FIG. 2), and is 3 μm at most at the position P4 where the inner edge portion of the peripheral groove 1022 is positioned. In addition, the thickness of the sealing layer 108 rapidly decreases downward in the peripheral groove 1022. At the inner end portion 110a of the peripheral sealing layer 110, a thickness t2 of the second sealing sublayer 1082 is smaller than a thickness t1 of the flat portion of the outer insulating sublayer 1021.

Thus, even in the case where the peripheral portion of the second sealing sublayer 1082 extends to the inside of the peripheral groove 1022, the third sealing sublayer 1083 of the sealing layer 108 is prevented from being strongly pressed by a bottom portion of a gap-forming material 1101 which is positioned at the innermost in the peripheral sealing layer 110, owing to gap formation and positioning performed stably by using the gap-forming materials 1101, which are disposed between the top surface of the outer insulating sublayer 1021 and a bottom surface of the color filter substrate 111.

Further, in FIG. 9, the scale factor in the Z direction is considerably larger than the scale factor in the X direction for easy understanding, and accordingly the second sealing sublayer 1082 is illustrated so as to have a large film thickness t3 at the position P4 of the inner edge portion of the peripheral groove 1022 in the figure. In practice, when an ink of the second sealing sublayer 1082 is applied, the ink spreads beyond the position P4 to immediately flow into the peripheral groove 1022, and accordingly the film thickness t3 of the second sealing sublayer 1082 at the position P4 is extremely thin, 1 μm at most. Thus, a height of a top surface of the third sealing sublayer 1083 suddenly decreases outside the inner edge portion (position closer to the outer insulating sublayer 1021 than the position P4 is) in the peripheral groove 1022.

Due to this, as long as the inner end portion 110a of the peripheral sealing layer 110 is positioned outside the position P4 (closer to the outer insulating sublayer 1021 than the position P4 is), even in the case where the inner end portion 110a of the peripheral sealing layer 110 comes into abutment with the third sealing sublayer 1083, the bottom portion of the gap-forming material 1101, which is positioned at the innermost in the peripheral sealing layer 110, does not apply a pressing force enough to break through the third sealing sublayer 1083 of the sealing layer 108. This is owing to regulation by the gap-forming materials 1101 disposed above the outer insulating sublayer 1021 together with flexibility of the second sealing sublayer 1082.

As described above, the peripheral groove 1022 is provided and the inner end portion 110a of the peripheral sealing layer 110 is positioned outside the position P4 where the inner edge portion of the peripheral groove 1022 is positioned (closer to the outer insulating sublayer 1021 than the position P4 is). In other words, a distance (gap) between the surface of the color filter substrate 111 in contact with the peripheral sealing layer 110 and the surface of the third sealing sublayer 1083 in contact with the peripheral sealing layer 110 is smaller at the flat portion of the top surface of the outer insulating sublayer 1021 where the second sealing sublayer 1082 is not layered than at the inner end portion 110a of the peripheral sealing layer 110. With this structure, the thickness of the second sealing sublayer 1082 at the inner end portion 110a of the peripheral sealing layer 110 can be reduced to be smaller than the thickness (t1) of the flat portion of the outer insulating sublayer 1021. This suppresses a pressing force applied by the inner end portion 110a of the peripheral sealing layer 110 to the third sealing sublayer 1083, at least compared with the conventional structure illustrated in FIG. 13, thereby significantly reducing a risk of damage on the third sealing sublayer 1083 and thus deterioration in sealing properties.

<Summary of Effects>

The following effects are achieved by the disclosure in at least one embodiment described above.

(1) The peripheral groove 1022 is provided in the interlayer insulating layer 102 so as to divide the interlayer insulating layer into the outer insulating sublayer 1021 and the inner insulating sublayer 1023. Thus, in formation of the second sealing sublayer 1082 of the sealing layer 108 by an application method, an ink spread does not extend beyond the inner end portion of the outer insulating sublayer 1021 (a range from the position P5 to a position P6). Further, the inner end portion 110a of the peripheral sealing layer 110 is positioned in the peripheral groove 1022, and the thickness of the second sealing sublayer 1082 is, at the inner end portion 110a of the peripheral sealing layer 110, smaller than the thickness of the flat portion of the outer insulating sublayer 1021 (a case where the thickness of the second sealing sublayer 1082 is "zero" is included). Thus, in pressure-bonding of the color filter substrate 111, the third sealing sublayer 1083 of the sealing layer 108 is prevented from being pressed and damaged by the gap-forming materials 1101, thereby maintaining the sealing properties.

Figure 12:
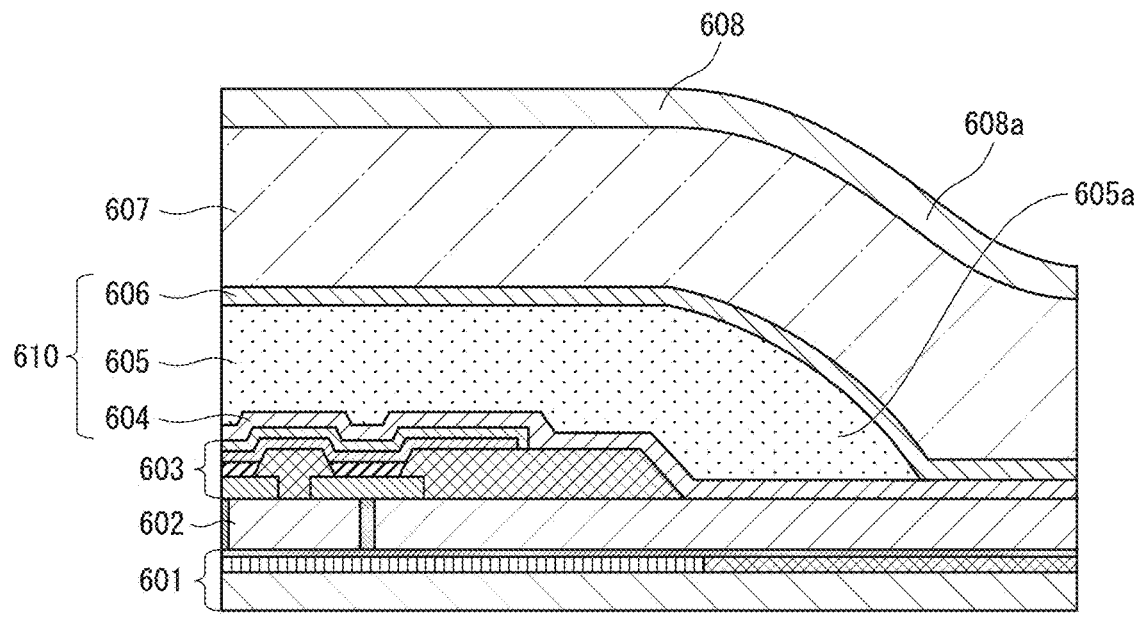
FIG. 12 is a schematic cross-section diagram illustrating a layered structure of a peripheral portion of a conventional organic EL display panel which is a premise for explaining a problem to be solved by the present disclosure.

At this time, the peripheral portion of the color filter substrate 111 is supported via the peripheral sealing layer 110, which is disposed above the outer insulating sublayer 1021, and thus no drooped portion is generated unlike the structure as illustrated in FIG. 12. This causes no irregular viewing angle to improve the image quality.

(2) The interlayer insulating layer 102, which includes resin easily absorbing moisture, including its outer end portion, is covered by the first sealing sublayer 1081 and the third sealing sublayer 1083, which each include an inorganic material absorbing no moisture. This effectively prevents moisture penetration from a direction along the lower substrate 101.

(3) The interlayer insulating layer 102 is divided completely by the peripheral groove 1022 into the outer insulating sublayer 1021 and the inner insulating sublayer 1023, and an inner surface and the bottom of the peripheral groove 1022 are covered by the first sealing sublayer 1081. Thus, even when moisture penetrates into the outer insulating sublayer 1021, the moisture cannot easily penetrate into the inner insulating sublayer 1023 because of being blocked by the peripheral groove 1022 and the first sealing sublayer 1081.

<<Modifications>>

The embodiments described above illustrate beneficial examples of the present disclosure. Numerical values, shapes, materials, constituent elements, arrangement positions and connections of constituent elements, steps, order of steps, and the like indicated in the embodiments are merely examples and can be appropriately modified without departing from the scope of the present disclosure.

The following describes modifications of the organic EL display panel pertaining to the present disclosure.

Figure 10:
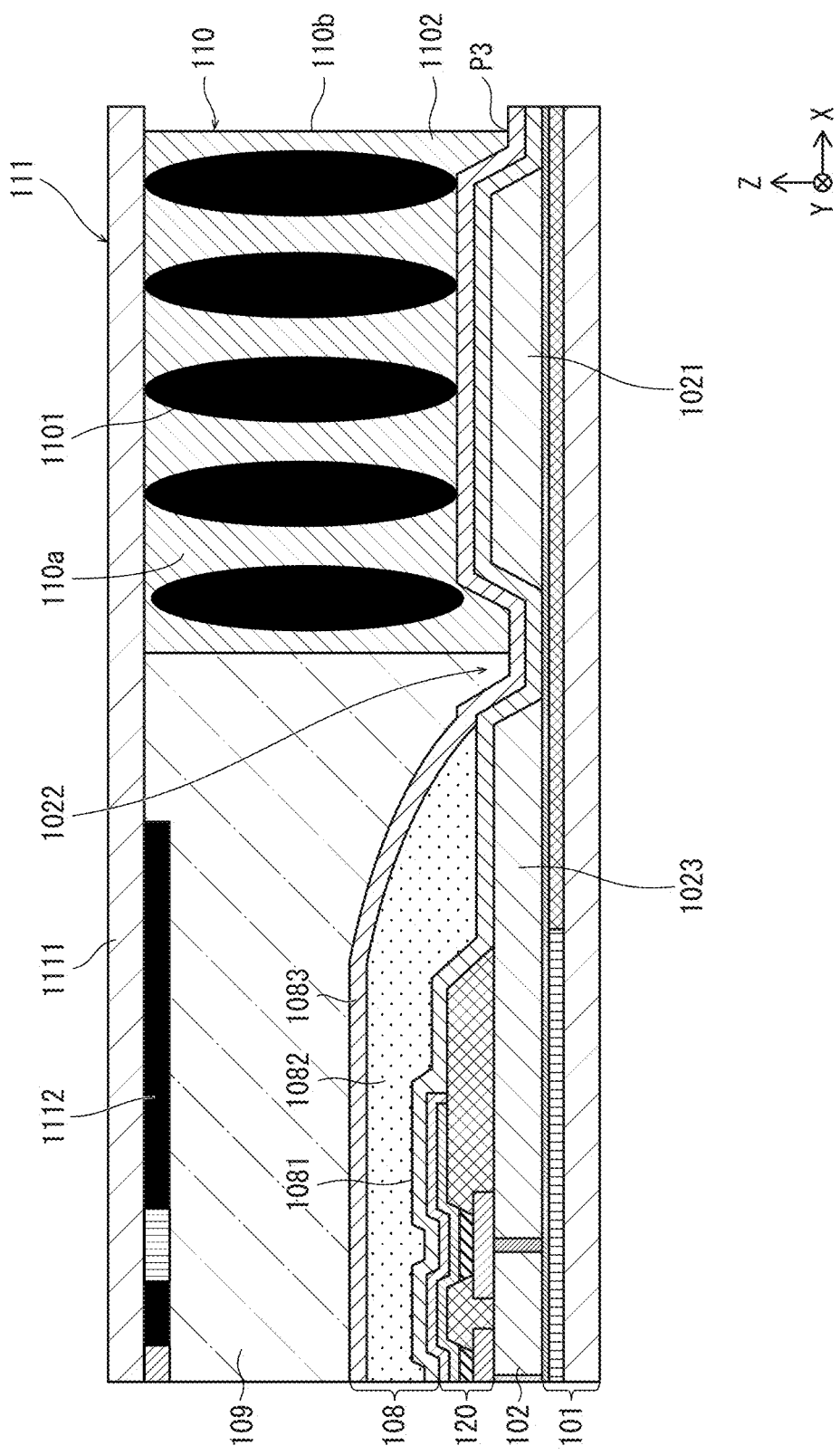
FIG. 10 is a schematic cross-section diagram illustrating a layered structure of a first modification of the organic EL display panel pertaining to the present disclosure.

(1) In the above embodiments, when viewed in a cross section perpendicular to the lower substrate 101 and across the peripheral groove 1022, an outer end portion 110b of the peripheral sealing layer 110 is positioned at the position P2 on the flat portion of the top surface of the outer insulating sublayer 1021 (see FIG. 2 and FIG. 9). Alternatively, as illustrated in FIG. 10, the peripheral sealing layer 110 may be increased in width such that its outer end portion 110b extends to a position P3 outside the outer end of the outer insulating sublayer 1021.

With this structure, even in the case where at least one of the first sealing sublayer 1081 and the third sealing sublayer 1083 has sealing defects such as pinholes, the resin material 1102 of the peripheral sealing layer 110 suppresses direct contact of moisture with these layers, and thus penetration of moisture and the like into the outer insulating sublayer 1021 becomes more difficult. This improves the sealing properties.

Figure 11:
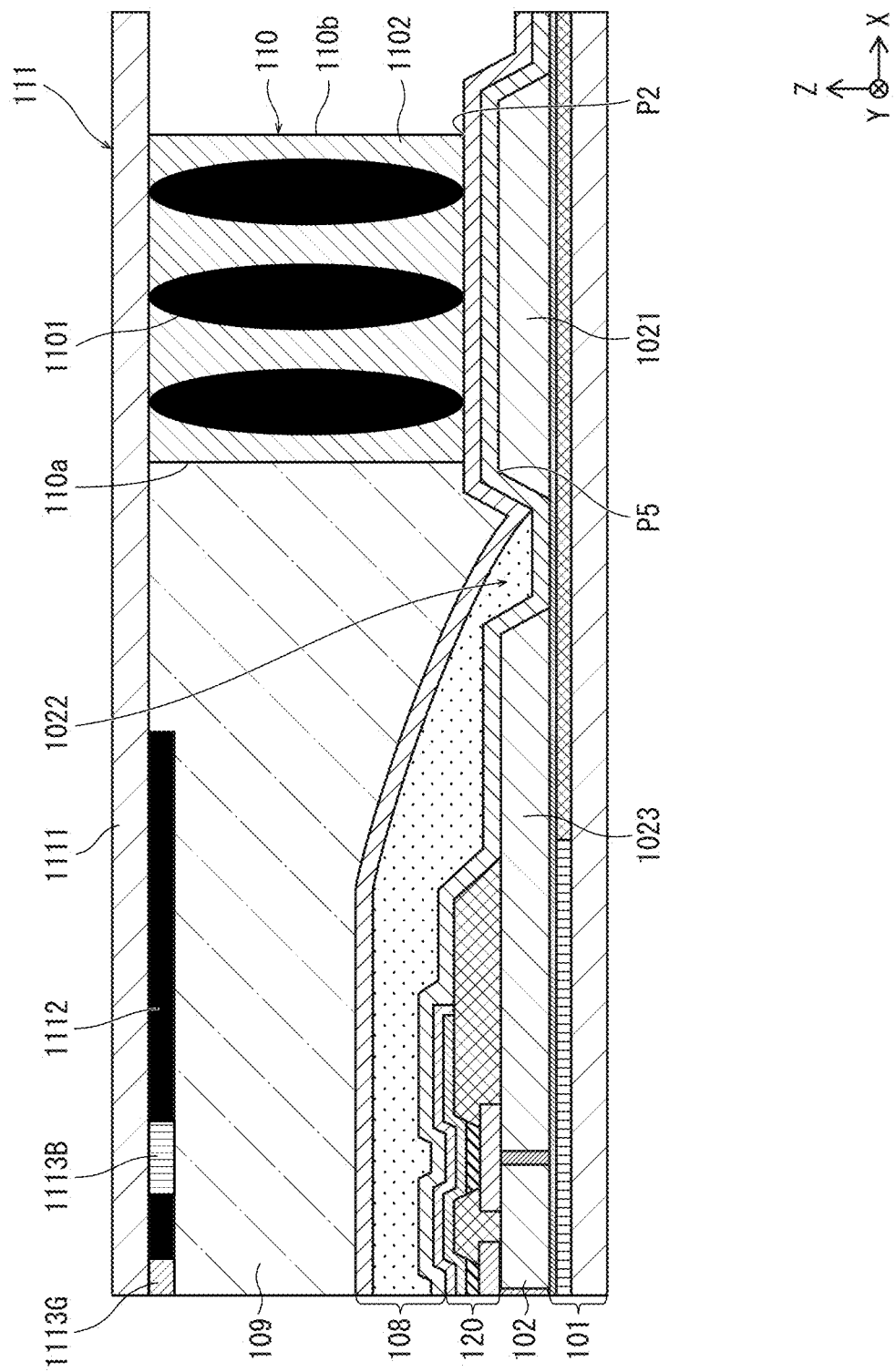
FIG. 11 is a schematic cross-section diagram illustrating a layered structure of a second modification of the organic EL display panel pertaining to the present disclosure.

(2) According to a structure in which the whole organic EL display panel 100 pertaining to the above second embodiment (see FIG. 9) is structured to be flexible, each time the organic EL display panel 100 is flexed, a large pressure is exerted on the third sealing sublayer 1083 by the bottom portion of the gap-forming material 1101, which is positioned at the innermost in the peripheral sealing layer 110 and directly above the second sealing sublayer 1082 including a resin material. This causes a risk of damaging the third sealing sublayer 1083. Accordingly, in this case, as illustrated in FIG. 11, a preferable position of the inner end portion 110a of the peripheral sealing layer 110 is outside the position P5 where an inner edge portion of the flat portion of the top surface of the outer insulating sublayer 1021 is positioned.

(3) In the above embodiments, a wet film-forming process such as printing, spin coating, an inkjet process, or the like is used as a process of forming the light-emitting layers, but the present disclosure should not be construed as being limited to this. For example, a dry film-forming process can be used such as vacuum vapor deposition, electron beam deposition, sputtering, reactive sputtering, ion plating, or a vapor phase growth process. Further, publicly-known materials may be appropriately used as materials of each component.

(4) In the above embodiments, the first sealing sublayer 1081 and the third sealing sublayer 1083 are the same in terms of film-forming conditions and composition. However, their film-forming conditions and composition need not necessarily be exactly the same, and may be appropriately modified by those skilled in the art.

Further, since inorganic materials typically have a lower moisture absorbing property than resins, another appropriate inorganic material (such as silicon oxynitride (SiON) or silicon carbide (SiC)) may be used for a material of the first sealing sublayer 1081 and the third sealing sublayer 1083 instead of or in addition to silicon nitride (SiN) described above.

(5) In the above embodiments, the description has been provided on the color filter substrate 111 as the second substrate to be joined onto the sealing layer 108. Alternatively, a known polarizing film may be joined instead of the color filter substrate 111 (see for example Japanese Patent Application Publication No. H7-142170, Japanese Patent Application Publication No. 2001-004837, and the like). When light enters from the outside and is reflected in the organic EL display panel 100 (specifically in the pixel electrodes 103), the polarizing film makes it difficult for the light to transmit to the outside. This improves visibility of the organic EL display panel 100 in outdoors and the like.

Further, in the above embodiments, organic materials each emitting the R, G, or B light emission color are used for the light-emitting layers 105. Alternatively, an organic material only emitting white light may be used for color display by the color filter substrate 111.

(6) In the case where the base material 101a is a flexible substrate including resin as in the above embodiments, a sealing film similar to the first sealing sublayer 1081 and the third sealing sublayer 1083 pertaining to the above embodiments may be disposed between the base material 101a and the TFT layer 101b. This structure suppresses moisture penetration from the substrate side.

(7) In the above embodiments, the organic EL elements each include a pixel electrode, a light-emitting layer, an electron transport layer, and a counter electrode. Alternatively, the organic EL elements may each include at least one of a hole injection layer and a hole transport layer between the pixel electrode and the light-emitting layer. Further alternatively, the organic EL elements may each include an electron injection layer between the electron transport layer and the counter electrode.

Further, in the above embodiments, the organic EL display panel is of the top-emission type having the pixel electrodes as light-reflective electrodes and having the counter electrode as a light-transmissive electrode. Alternatively, the present disclosure is applicable to organic EL display panels of a bottom-emission type having pixel electrodes as light-transmissive electrodes and having a counter electrode as a light-reflective electrode.

(8) In the above embodiments, as illustrated in for example FIG. 2, both the respective outer peripheral portion of the first sealing sublayer 1081 and the third sealing sublayer 1083 extend up to the outside of the outer end of the outer insulating sublayer 1021 to cover the top surface and outer side surfaces of the outer insulating sublayer 1021. Alternatively, at least one of the first sealing sublayer 1081 and the third sealing sublayer 1083 may cover the top surface and the outer side surfaces of the outer insulating sublayer 1021 to prevent easy penetration of external moisture into the outer insulating sublayer 1021.

(9) In the above embodiments, the peripheral sealing layer 110 includes the gap-forming materials 1101 which are spherical. Alternatively, any material securing a certain thickness, for example, short fibrous fillers can be included as the gap-forming materials 1101.

(10) Description has been provided above of an organic EL display panel in which organic EL light-emitting layers are used. In addition to such organic EL display panels, self-luminous display panels such as inorganic EL display panels including inorganic EL light-emitting layers and quantum dot display panels including quantum dot light-emitting layers (see for example Japanese Patent Application Publication No. 2010-199067) have a structure similar to organic EL display panels including light-emitting layers disposed between pixel electrodes and a counter electrode, except only types of the light-emitting layers. Accordingly, by structuring a sealing structure similar to that in the above embodiments, the self-luminous display panels can exhibit improved sealing properties and achieve high-quality display images with no irregular viewing angle in the peripheral portion of the image display region.

<<Supplement>>

Description has been provided above of organic EL display panels as an example of self-luminous display panels pertaining to the present disclosure and a method of manufacturing the organic EL display panels, based on the embodiments and modifications, but the present disclosure is not limited to the embodiments and modifications described above.

Although one or more embodiments pertaining to the present disclosure have been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. A self-luminous display panel that has an image display region and a peripheral region around the image display region in plan view, the self-luminous display panel comprising:
a first substrate;
an insulating resin layer that is disposed above the first substrate;
self-luminous elements that are disposed above the insulating resin layer in an area corresponding to the image display region;
a sealing layer that is disposed above the self-luminous elements;
an attachment layer that is disposed above the sealing layer; and
a second substrate that is disposed above the attachment layer, wherein
the insulating resin layer includes an inner insulating sublayer and an outer insulating sublayer with a groove therebetween, the groove being provided in the peripheral region and surrounding the image display region,
the sealing layer includes a first sealing sublayer, a second sealing sublayer, and a third sealing sublayer that respectively include an inorganic material, a resin material, and an inorganic material,
in a range in plan view including the image display region and extending to at most an inner end portion of the outer insulating sublayer, the first sealing sublayer, the second sealing sublayer, and the third sealing sublayer are layered in this order,
outside the range in plan view, the first sealing sublayer and the third sealing sublayer are in direct contact with each other,
the attachment layer includes:
a peripheral sealing layer that is positioned inside a peripheral portion of the second substrate; and
a joining layer that is positioned in a range surrounded by the peripheral sealing layer, and
when viewed in a cross section perpendicular to a main surface of the first substrate and across the groove, the peripheral sealing layer is at least partially positioned on the outer insulating sublayer, and an inner end portion of the peripheral sealing layer extends to a point within the groove.

2. The self-luminous display panel of claim 1, wherein at the inner end portion of the peripheral sealing layer, thickness of the second sealing sublayer is smaller than thickness of the outer insulating sublayer.

3. The self-luminous display panel of claim 1, wherein outside the range in plan view, the first sealing sublayer and the third sealing sublayer cover an outer end portion of the outer insulating sublayer.

4. The self-luminous display panel of claim 1, wherein in plan view, an outer end portion of the peripheral sealing layer is positioned outside an outer end portion of the outer insulating sublayer.

5. The self-luminous display panel of claim 1, wherein the second substrate is a color filter substrate including filters of at least a red color, a green color, and a blue color.

6. The self-luminous display panel of claim 1, wherein the second sealing sublayer is an applied film.

7. The self-luminous display panel of claim 1, wherein the peripheral sealing layer includes an ultraviolet-curing resin material in which spherical gap-forming members are dispersed.

8. A method of manufacturing a self-luminous display panel that has an image display region and a peripheral region around the image display region in plan view, the method comprising:
preparing a first substrate;
forming an insulating resin layer above the first substrate;
forming self-luminous elements above the insulating resin layer in an area corresponding to the image display region;
forming a sealing layer above the self-luminous elements; and
joining a second substrate onto the sealing layer, wherein
the forming the insulating resin layer includes providing, in the peripheral region, a groove surrounding the image display region, so as to divide the insulating resin layer into an inner insulating sublayer and an outer insulating sublayer,
the forming the sealing layer includes:
layering, in a range in plan view including the image display region and extending to at most an inner end portion of the outer insulating sublayer, a first sealing sublayer, a second sealing sublayer, and a third sealing sublayer in this order, the first sealing sublayer, the second sealing sublayer, and the third sealing sublayer respectively including an inorganic material, a resin material, and an inorganic material; and layering, outside the range in plan view, the first sealing sublayer and the third sealing sublayer in direct contact with each other, the joining the second substrate includes joining the second substrate onto the sealing layer via a peripheral sealing layer and a joining layer, the peripheral sealing layer being disposed inside a peripheral portion of the second substrate, the joining layer being disposed in a range surrounded by the peripheral sealing layer, and when viewed in a cross section perpendicular to a main surface of the first substrate and across the groove, the peripheral sealing layer is at least partially positioned on the outer insulating sublayer, and an inner end portion of the peripheral sealing layer extends to a point within the groove.

* * * * *